(12) United States Patent
Philipp et al.

(10) Patent No.: US 7,719,886 B2
(45) Date of Patent: May 18, 2010

(54) MULTI-LEVEL RESISTIVE MEMORY CELL USING DIFFERENT CRYSTALLIZATION SPEEDS

(75) Inventors: Jan Boris Philipp, Peekskill, NY (US); Thomas Happ, Tarrytown, NY (US)

(73) Assignee: Qimonda North America Corp., Cary, NC (US)

( * ) Notice: Subject to any disclaimer, the term of this patent is extended or adjusted under 35 U.S.C. 154(b) by 301 days.

(21) Appl. No.: 11/743,987

(22) Filed: May 3, 2007

(65) Prior Publication Data

US 2008/0273378 A1 Nov. 6, 2008

(51) Int. Cl.
*G11C 11/00* (2006.01)
(52) U.S. Cl. .................. 365/163; 365/148; 365/46; 977/754
(58) Field of Classification Search ............... 365/46, 365/94, 100, 113, 148, 163, 129; 257/2–5, 257/296, E31.047, E27.006; 438/29, 95, 438/96, 166, 365, 482, 486, 597, 259; 977/754
See application file for complete search history.

(56) References Cited

U.S. PATENT DOCUMENTS

| | | | | |
|---|---|---|---|---|
| 6,141,241 | A * | 10/2000 | Ovshinsky et al. | 365/163 |
| 6,418,049 | B1 * | 7/2002 | Kozicki et al. | 365/174 |
| 6,674,115 | B2 | 1/2004 | Hudgens et al. | |
| 2005/0051901 | A1 | 3/2005 | Chen | |
| 2005/0112896 | A1 | 5/2005 | Hamann et al. | |
| 2006/0077706 | A1 * | 4/2006 | Li et al. | 365/163 |
| 2006/0208847 | A1 * | 9/2006 | Lankhorst et al. | 338/9 |
| 2007/0008768 | A1 * | 1/2007 | Daley | 365/148 |

FOREIGN PATENT DOCUMENTS

WO    WO 2004057676 A2 *    7/2004

OTHER PUBLICATIONS

"Nitrogen-implanted Ge2Sb2Te5 film used as multilevel storage media for phase change random access memory," to Bo Liu, et al., Institute of Physics Publishing Semiconductor Science and Technology No. 19, Apr. 24, 2004, L61-L64.*
S. Lai, T. Lowrey, "OUM-a 180 NM Non Volatile Memory Cell Element Technology for Stand Alone and Embedded Applications", IEDM 2001.
S. Lai, "Current Status of the Phase Change Memory and its Future", IEDM 2003.
Y.N. Hwang, et al., "Full Integration and Reliability Evaluation of Phase-Change RAM Based .24um-CMOS Technologies", VLSI Technology, 2003.

(Continued)

*Primary Examiner*—Richard Elms
*Assistant Examiner*—Harry W Byrne
(74) *Attorney, Agent, or Firm*—Dicke, Billig & Czaja, PLLC

(57) ABSTRACT

An integrated circuit includes a first electrode and a second electrode. The integrated circuit includes a first resistivity changing material between the first electrode and the second electrode and a second resistivity changing material between the first electrode and the second electrode. The first resistivity changing material and the second resistivity changing material have different crystallization speeds.

18 Claims, 19 Drawing Sheets

OTHER PUBLICATIONS

ECD Ovonics, Research Report, "Ovonic Unified Memory", http://www.ovonics.com/PDFs/Elec_Memory_Research_Report/OUM.pdf, 1999.

H. Horii, et al., "A Novel Cell Technology Using N-doped GeSbTe Films for Phase Change RAM", VLSI, 2003.

Y.N. Hwang, et al., "Full Integration and Reliability Evaluation of Phase-Change RAM Based on .24um-CMOS Technologies", VLSI 2003.

Jeong, et al., "Switching Current Scaling and Reliability Evaluation in PRAM", NVSMW 2004.

S.L. Cho, "Highly Scalable on-axis Confined Cell Structure for High Density PRAM Beyond 256Mb", VLSI 2005.

F. Pellizzer, et al., "Novel uTrench PCM Cell for Embedded and Standalone NVM Applications", VLSI, 2004.

S.J. Ahn, et al., "Highly Manufacturable High Density Phase Change Memory of 64Mb and Beyond", IEEE, 2004.

S. B. Kang, et al., "A .1um 1.8V 256Mb 66MHz Synchronous Burst PRAM", ISSCC 2006.

* cited by examiner

MULTI-LEVEL RESISTIVE MEMORY CELL USING DIFFERENT CRYSTALLIZATION SPEEDS

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. If the phase change memory cell is programmed to one of three different resistance levels, 1.5 bits of data per cell can be stored. If the phase change memory cell is programmed to one of four different resistance levels, two bits of data per cell can be stored, and so on. For simplicity, the description in this disclosure is substantially focused on three different resistance levels or states and 1.5 bits of data per cell. This is for illustrative purposes only, however, and not intended to limit the scope of the invention. In principle it is possible to store three or more states.

One way to store multiple bits of data is to include multiple layers of phase change material in a phase change memory cell. To program such a phase change memory cell, one should be able to write to different layers.

For these and other reasons, there is a need for the present invention.

SUMMARY

One embodiment provides an integrated circuit. The integrated circuit includes a first electrode and a second electrode. The integrated circuit includes a first resistivity changing material between the first electrode and the second electrode and a second resistivity changing material between the first electrode and the second electrode. The first resistivity changing material and the second resistivity changing material have different crystallization speeds.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
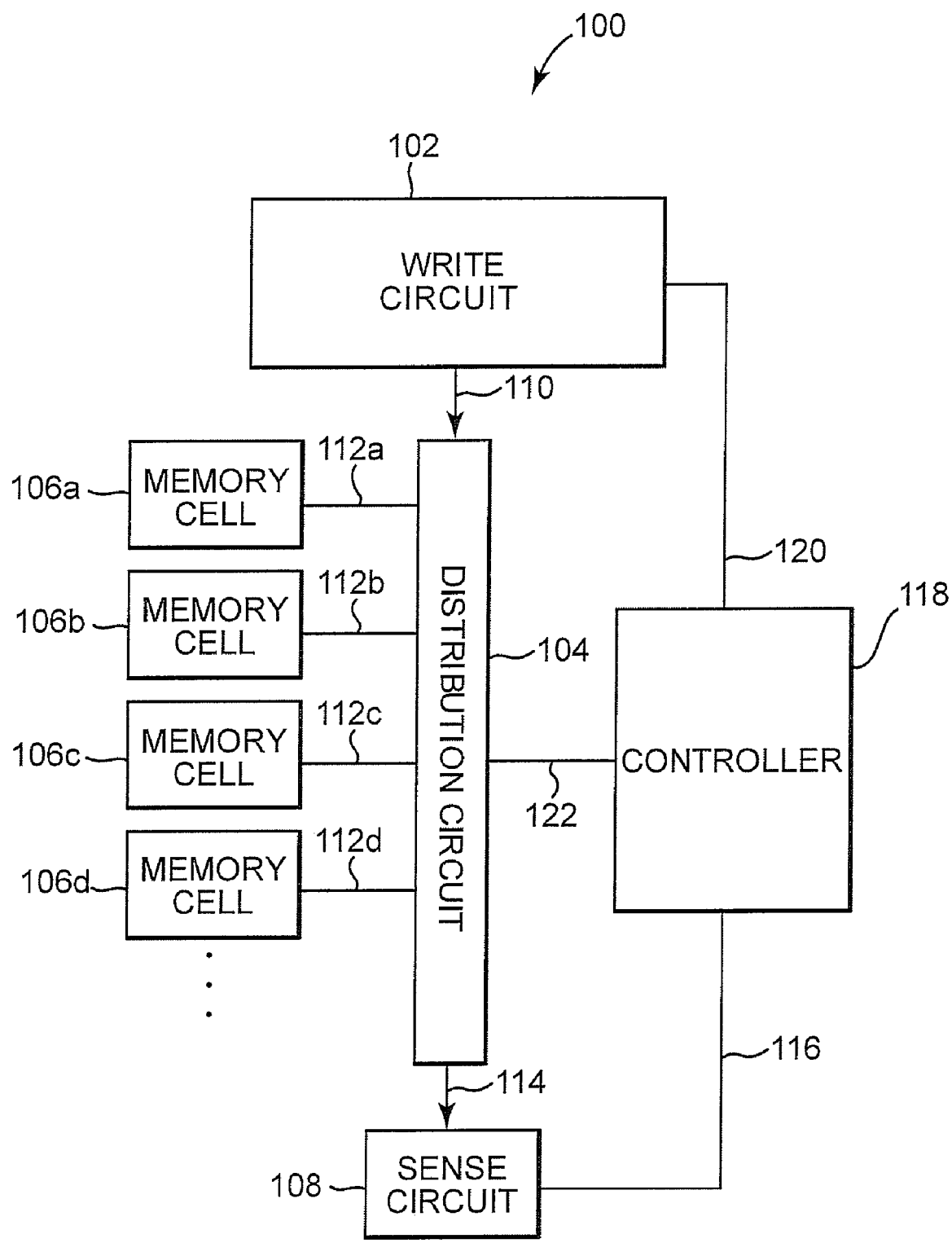
FIG. 1 is a block diagram illustrating one embodiment of a memory device.

FIG. 1 is a block diagram illustrating one embodiment of a memory device 100. Memory device 100 includes a write circuit 102, a distribution circuit 104, memory cells 106a, 106b, 106c, and 106d, a sense circuit 108, and a controller 118. Each of the memory cells 106a-106d is a phase change memory cell that stores data based on the amorphous and crystalline states of each of two or more layers of phase change material in the memory cell. Each of the memory cells 106a-106d can be programmed into three or more states by programming one or more of the phase change material layers. The number of layers with amorphous material and the number of layers with crystalline material in one of the memory cells 106a-106d—and hence the cell resistance—is controlled by controller 118 following a suitable write strategy.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to controller 118 through signal path 116. Controller 118 is also electrically coupled to write circuit 102 through signal path 120 and distribution circuit 104 through signal path 122.

Each of the memory cells 106a-106d includes a plurality of layers of one or more phase change materials, each layer having a different crystallization speed. One or more layers may be changed from an amorphous state to a crystalline state or from a crystalline state to an amorphous state under the influence of temperature change. The number of layers with crystalline phase change material and the number of layers with amorphous phase change material in one of the memory cells 106a-106d thereby defines three or more states for storing data within memory device 100.

In the amorphous state, a phase change material exhibits significantly higher resistivity than in the crystalline state. Therefore, by controlling the amorphous and crystalline states of each layer of phase change material, the more than two states of memory cells 106a-106d differ in their electrical resistivity. In one embodiment, the more than two states include three states and a ternary system is used, wherein the three states are assigned bit values of "0", "1", and "2". In another embodiment, the more than two states are four states that are assigned multi-bit values, such as "00", "01", "10", and "11". In other embodiments, the more than two states can be any suitable number of states.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access.

In one embodiment, write circuit 102 provides voltage pulses to distribution circuit 104 through signal path 110, and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-1 06d. In other embodiments, write circuit 102 provides current pulses to distribution circuit 104 through signal path 110, and distribution circuit 104 controllably directs the current pulses to memory cells 106a-106d through signal paths 112a-112d.

Sense circuit 108 reads each of the more than two states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write circuit 102 provides voltage across one of the memory cells 106a-106d and sense circuit 108 reads the current that flows through that one of the memory cells 106a-106d. In one embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates one or more current or voltage pulses for heating one or more phase change material layers in the target memory cell. In one embodiment, write circuit 102 generates appropriate current or voltage pulses, which are fed into distribution circuit 104 and distributed to the appropriate target memory cell 106a-106d. The current or voltage pulses amplitude and duration are controlled by controller 118 depending on the specific state to which the target memory cell 106a-106d is being programmed. Generally, a "set" operation of a memory cell is heating one or more layers of phase change material of the target memory cell above its crystallization temperature (but below its melting temperature) long enough to achieve the crystalline state in a selected number of phase change material layers. Generally, a "reset" operation of a memory cell is heating the phase change material of one or more phase change material layers of the target memory cell above their melting temperature, and then quickly quench cooling the material, thereby achieving the amorphous state in the selected phase change material layers. Generally, a "combination reset/set" operation of a memory cell is heating the phase change material of the target memory cell above its melting temperature, quickly quench cooling the material, and then heating one or more layers of phase change material of the target memory cell above their crystallization temperature (but below its melting temperature) long enough to achieve the crystalline state in a selected number of phase change material layers.

Figure 2A:
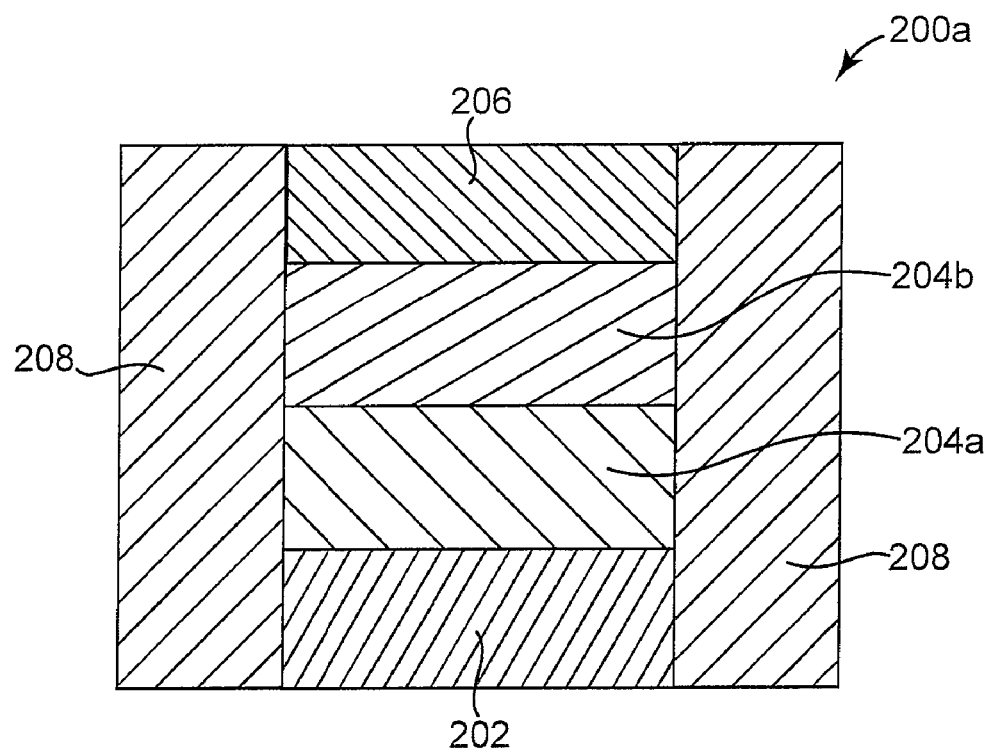
FIG. 2A illustrates a cross-sectional view of one embodiment of a phase change memory cell.

FIG. 2A illustrates a cross-sectional view of one embodiment of a phase change memory cell 200a. Phase change memory cell 200a includes a first electrode 202, a first phase change material layer 204a, a second phase change material layer 204b, a second electrode 206, and insulation material 208. First phase change material layer 204a is in contact with first electrode 202. Second phase change material layer 204b is in contact with first phase change material layer 204a and second electrode 206. First electrode 202, phase change material layers 204, and second electrode 206 are surrounded by insulation material 208.

First phase change material layer 204a and second phase change material layer 204b have different crystallization speeds. In one embodiment, first phase change material layer 204a includes a phase change material having a slower crystallization speed than second phase change material layer 204b. In another embodiment, first phase change material layer 204a includes a phase change material having a faster crystallization speed than second phase change material layer 204b.

Each phase change material layer 204 may be made up of a variety of materials in accordance with the present invention. Generally, chalcogenide alloys that contain one or more elements from group VI of the periodic table are useful as such materials. In one embodiment, phase change material layers 204 include a chalcogenide compound material, such as GeSbTe, SbTe, GeTe, or AgInSbTe. In another embodiment, phase change material layers 204 include a chalcogen-free material, such as GeSb, GaSb, InSb, or GeGaInSb. In other embodiments, phase change material layers 204 are made up of any suitable material including one or more of the elements Ge, Sb, Te, Ga, As, In, Se, and S.

In one embodiment, the phase change material with faster crystallization speed is doped GeSb that crystallizes in less than about 10 ns, and the phase change material with slower crystallization speed is doped GeSbTe that rystallizes in about 60 ns. In another embodiment, the phase change material with faster crystallization speed is doped GeSb that crystallizes in about less than about 10 ns, and the phase change material with slower crystallization speed is doped SbTe that crystallizes in about 30 ns. In another embodiment, the phase change material with faster crystallization speed is doped SbTe that crystallizes in about 30 ns, and the phase change material with slower crystallization speed is doped GeSbTe that crystallizes in about 60 ns. In another embodiment, the phase change material with faster crystallization speed is doped GeSb that crystallizes in less than about 10 ns, and the phase change material with slower crystallization speed is heavily doped GeSbTe that crystallizes in greater than about 1 µs. In another embodiment, the phase change material with faster crystallization speed is doped GeSbTe that crystallizes in about 60 ns, and the phase change material with slower crystallization speed is heavily doped GeSbTe that crystallizes in greater than about 1 µs. In other embodiments, the phase change material layers 204 are made up of any suitable phase change materials having different crystallization speeds.

Insulation material 208 can be any suitable insulator, such as SiO$_2$, fluorinated silica glass (FSG), boro-phosphorous silicate glass (BPSG), boro-silicate glass (BSG), or low-K material. First electrode 202 and second electrode 206 can be any suitable electrode material, such as TiN, TaN, W, Al, WN, TaSiN, TiSiN, TiAlN, C or Cu.

A selection device such as an active device like a transistor or diode, is coupled to one of first electrode 202 or second electrode 206 to control the application of current or voltage pulses to the other of first electrode 202 or second electrode 206, and thus to phase change material layers 204, to set and reset phase change material layers 204. If first phase change material layer 204a has a faster crystallization speed than second phase change material layer 204b, then a current or voltage pulse having a lower amplitude and/or duration is used to program first phase change material layer 204a than to program second phase change material layer 204b. If second phase change material layer 204b has a faster crystallization speed than first phase change material layer 204a, then a current or voltage pulse having a lower amplitude and/or duration is used to program second phase change material layer 204b than to program first phase change material layer 204a.

During operation of phase change memory cell 200a, current or voltage pulses are applied between first electrode 202 and second electrode 206 to program phase change memory cell 200a. In one embodiment, a first current or voltage pulse having a first amplitude and/or duration programs second phase change material layer 204b. A second current or voltage pulse having a second amplitude and/or duration programs first phase change material layer 204a. In another embodiment, the first current or voltage pulse having the first amplitude and/or duration programs first phase change material layer 204a. The second current or voltage pulse having the second amplitude and/or duration programs second phase change material layer 204b. The second amplitude and/or duration is greater than the first amplitude and/or duration.

By selectively programming phase change material layers 204, phase change memory cell 200a can be programmed to provide three states in phase change material layers 204. In one embodiment, in a first state, phase change material layers 204 are amorphous. In a second state, second phase change material layer 204b is crystalline, and first phase change material layer 204a is amorphous. In a third state, phase change material layers 204 are crystalline. In another embodiment, in a first state, phase change material layers 204 are amorphous. In a second state, first phase change material layer 204a is crystalline, and second phase change material layer 204b is amorphous. In a third state, phase change material layers 204 are crystalline. In another embodiment, in a first state, phase change material layers 204 are crystalline. In a second state, second phase change material layer 204b is amorphous, and first phase change material layer 204a is crystalline. In a third state, phase change material layers 204 are amorphous. In another embodiment, in a first state, phase change material layers 204 are crystalline. In a second state, first phase change material layer 204a is amorphous, and second phase change material layer 204b is crystalline. In a third state, phase change material layers 204 are amorphous. In other embodiments, any suitable number of phase change material layers 204 are used for obtaining a desired number of states in phase change memory cell 200a.

Figure 2B:
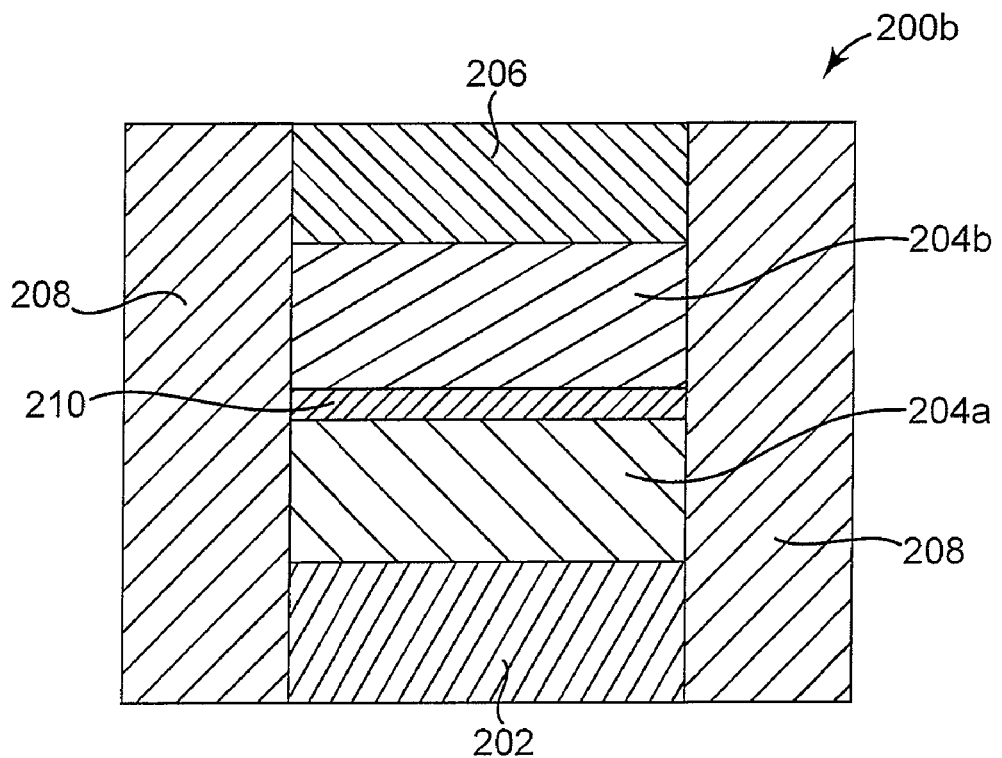
FIG. 2B illustrates a cross-sectional view of another embodiment of a phase change memory cell.

FIG. 2B illustrates a cross-sectional view of another embodiment of a phase change memory cell 200b. Phase change memory cell 200b includes a first electrode 202, a first phase change material layer 204a, a second phase change material layer 204b, a second electrode 206, insulation material 208, and a diffusion barrier 210. First, phase change material layer 204a is in contact with first electrode 202. Diffusion barrier 210 is in contact with first phase change material layer 204a. Second phase change material layer 204b is in contact with diffusion barrier 210 and second electrode 206. First electrode 202, phase change material layers 204, second electrode 206, and diffusion barrier 210 are surrounded by insulation material 208.

Phase change memory cell 200b is similar to phase change memory cell 200a in composition and operation, except that phase change memory cell 200b includes diffusion barrier 210. Diffusion barrier 210 can be any suitable diffusion barrier material, such as TiN, TaN, W, Al, WN, TaSiN, TiSiN, TiAlN, C or Cu. Diffusion barrier 210 prevents diffusion between phase change material layers 204.

Figure 2C:
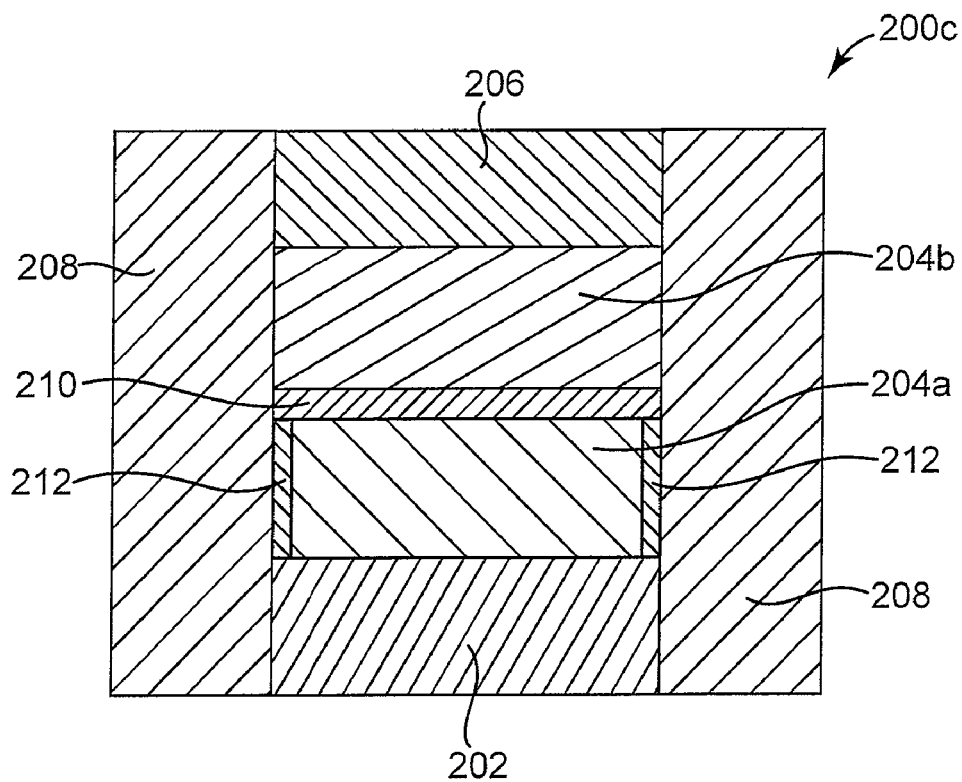
FIG. 2C illustrates a cross-sectional view of another embodiment of a phase change memory cell.

FIG. 2C illustrates a cross-sectional view of another embodiment of a phase change memory cell 200c. Phase change memory cell 200c includes a first electrode 202, a first phase change material layer 204a, a second phase change material layer 204b, a second electrode 206, insulation material 208, an optional diffusion barrier 210, and shunt resistors 212. First phase change material layer 204a is in contact with first electrode 202. Diffusion barrier 210 is in contact with first phase change material layer 204a. Second phase change material layer 204b is in contact with diffusion barrier 210 and second electrode 206. Shunt resistors 212 are in contact with first phase change material layer 204a, diffusion barrier 210, and first electrode 202. First electrode 202, phase change material layers 204, second electrode 206, diffusion barrier 210, and shunt resistors 212 are surrounded by insulation material 208.

Phase change memory cell 200c is similar to phase change memory cell 200b in composition and operation, except that phase change memory cell 200c includes shunt resistors 212. Shunt resistors 212 limit the resistance of first phase change material layer 204a.

Figure 2D:
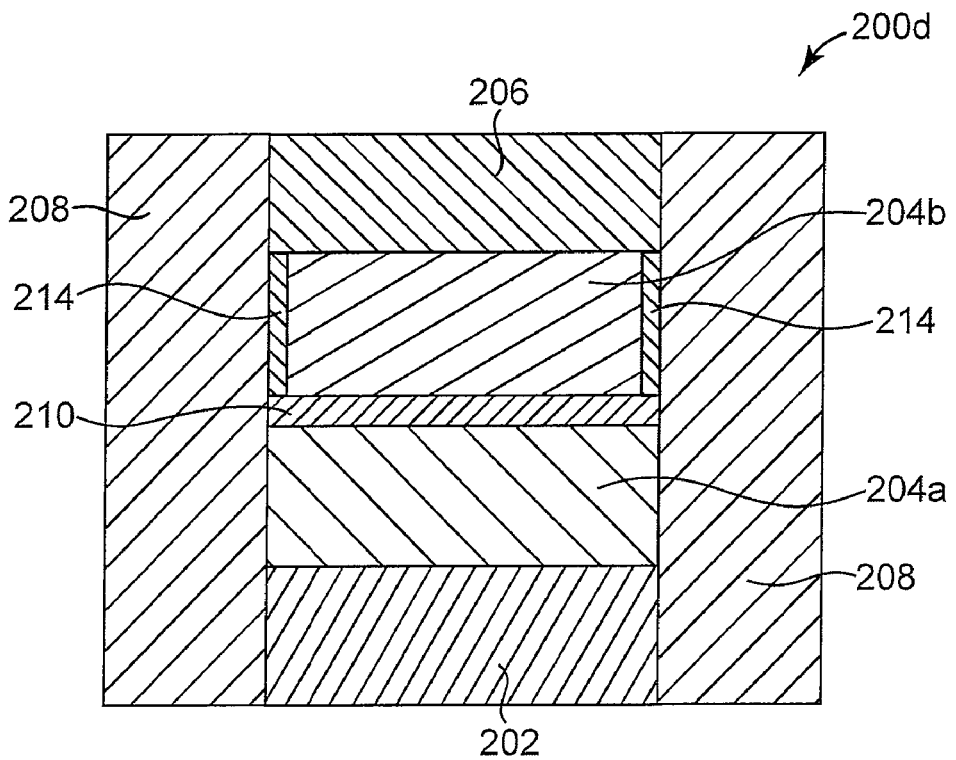
FIG. 2D illustrates a cross-sectional view of another embodiment of a phase change memory cell.

FIG. 2D illustrates a cross-sectional view of another embodiment of a phase change memory cell 200d. Phase change memory cell 200d includes a first electrode 202, a first phase change material layer 204a, a second phase change material layer 204b, a second electrode 206, insulation material 208, an optional diffusion barrier 210, and shunt resistors 214. First phase change material layer 204a is in contact with first electrode 202. Diffusion barrier 210 is in contact with first phase change material layer 204a. Second phase change material layer 204b is in contact with diffusion barrier 210 and second electrode 206. Shunt resistors 214 are in contact with second phase change material layer 204b, diffusion barrier 210, and second electrode 206. First electrode 202, phase change material layers 204, second electrode 206, diffusion barrier 210, and shunt resistors 214 are surrounded by insulation material 208.

Phase change memory cell 200d is similar to phase change memory cell 200b in composition and operation, except that phase change memory cell 200d includes shunt resistors 214. Shunt resistors 214 limit the resistance of second phase change material layer 204b.

Figure 2E:
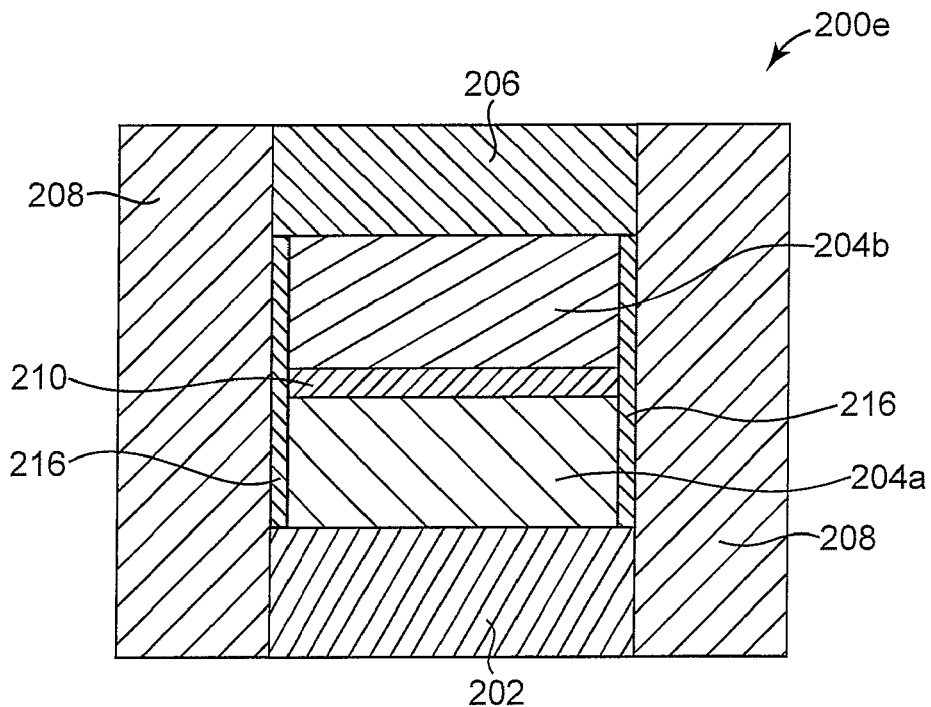
FIG. 2E illustrates a cross-sectional view of another embodiment of a phase change memory cell.

FIG. 2E illustrates a cross-sectional view of another embodiment of a phase change memory cell 200e. Phase change memory cell 200e includes a first electrode 202, a first phase change material layer 204a, a second phase change material layer 204b, a second electrode 206, insulation material 208, an optional diffusion barrier 210, and shunt resistors 216. First phase change material layer 204a is in contact with first electrode 202. Diffusion barrier 210 is in contact with first phase change material layer 204a. Second phase change material layer 204b is in contact with diffusion barrier 210 and second electrode. 206. Shunt resistors 216 are in contact with phase change material layers 204, first electrode 202, and second electrode 206. First electrode 202, phase change material layers 204, second electrode 206, diffusion barrier 210, and shunt resistors 216 are surrounded by insulation material 208.

Phase change memory cell 200e is similar to phase change memory cell 200b in composition and operation, except that phase change memory cell 200e includes shunt resistors 216. Shunt resistors 216 limit the resistance of phase change material layers 204.

Figure 3A:
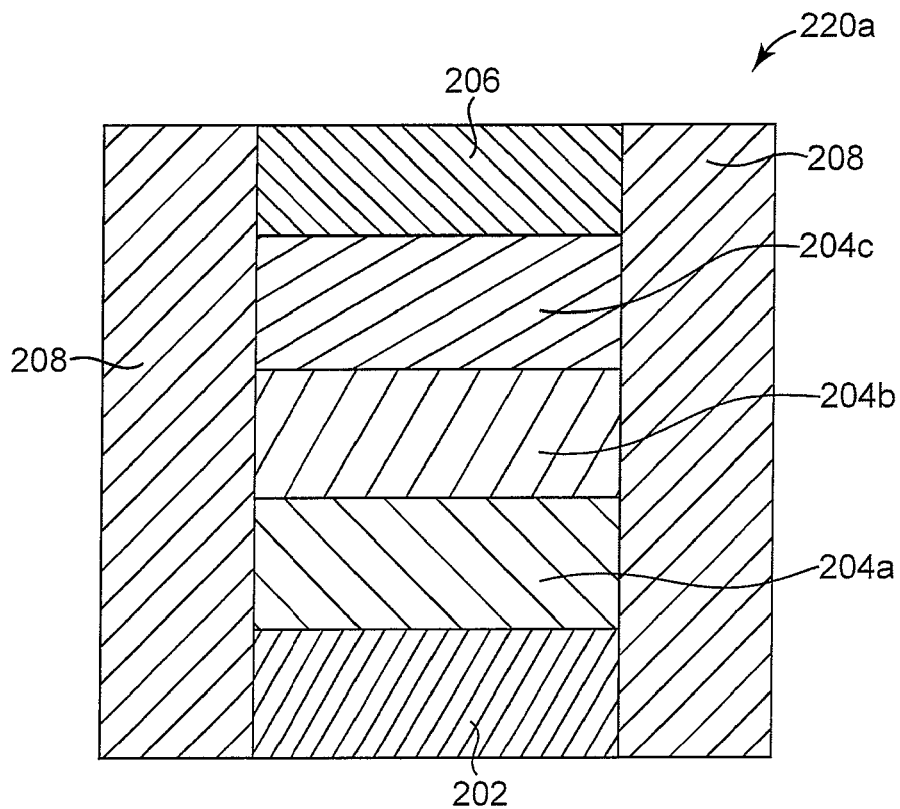
FIG. 3A illustrates a cross-sectional view of another embodiment of a phase change memory cell.

FIG. 3A illustrates a cross-sectional view of another embodiment of a phase change memory cell 220a. Phase change memory cell 220a includes a first electrode 202, a first phase change material layer 204a, a second phase change material layer 204b, a third phase change material layer 204c, a second electrode 206, and insulation material 208. First phase change material layer 204a is in contact with first electrode 202. Second phase change material layer 204b is in contact with first phase change material layer 204a. Third phase change material layer 204c is in contact with second phase change material layer 204b and second electrode 206. First electrode 202, phase change material layers 204, and second electrode 206 are surrounded by insulation material 208.

Phase change material layers 204 have different crystallization speeds. In one embodiment, first phase change material layer 204a includes a phase change material with a first crystallization speed. Second phase change material layer 204b includes a phase change material with a second crystallization speed. Third phase change material layer 204c includes a phase change material with a third crystallization speed. In one embodiment, the second crystallization speed is faster than the first crystallization speed, and the third crystallization speed is faster than the second crystallization speed. In other embodiments, phase change material layers 204 are made up of any suitable order of phase change materials with the first, second, and third crystallization speeds.

A selection device such as an active device like a transistor or diode, is coupled to one of first electrode 202 or second electrode 206 to control the application of current or voltage pulses to the other of first electrode 202 or second electrode 206, and thus to phase change material layers 204, to set and reset phase change material layers 204. A first current or voltage pulse having a first amplitude and/or duration programs the phase change material with the third crystallization speed. A second current or voltage pulse having a second amplitude and/or duration programs the phase change material with the second crystallization speed. A third current or voltage pulse having a third amplitude and/or duration programs the phase change material with the first crystallization speed. The third amplitude and/or duration is greater than the second amplitude and/or duration. The second amplitude and/or duration is greater than the first amplitude and/or duration.

During operation of phase change memory cell 220a, current or voltage pulses are applied between first electrode 202 and second electrode 206 to program phase change memory cell 220a. In one embodiment, the first current or voltage pulse having the first amplitude and/or duration programs third phase change material layer 204c. The second current or voltage pulse having the second amplitude and/or duration programs second phase change material layer 204b. The third current or voltage pulse having the third amplitude and/or duration programs first phase change material layer 204a. In other embodiments, first, second, and third current or voltage pulses program any suitable order of phase change material layers 204, depending on the crystallization speed of the phase change material in each of phase change material layers 204.

By selectively programming phase change material layers 204, phase change memory cell 220a can be programmed to provide four states in phase change material layers 204. In one embodiment, in a first state, phase change material layers 204 are amorphous. In a second state, third phase change material layer 204c is crystalline, and first and second phase change material layers 204a and 204b are amorphous. In a third state, second and third phase change material layers 204b and 204c are crystalline, and first phase change material layer 204a is amorphous. In a fourth state, phase change material layers 204 are crystalline.

In another embodiment, in a first state, phase change material layers 204 are crystalline. In a second state, third phase change material layer 204c is amorphous, and first and second phase change material layers 204a and 204b are crystalline. In a third state, second and third phase change material layers 204b and 204c are amorphous, and first phase change material layer 204a is crystalline. In a fourth state, phase change material layers 204 are amorphous. In other embodiments, each of phase change material layers 204 is programmed to be amorphous or crystalline in any suitable order, depending on the crystallization speed of the phase change material in each of phase change material layers 204. In other embodiments, any suitable number of phase change material layers 204 are used for obtaining a desired number of states in phase change memory cell 220a.

Figure 3B:
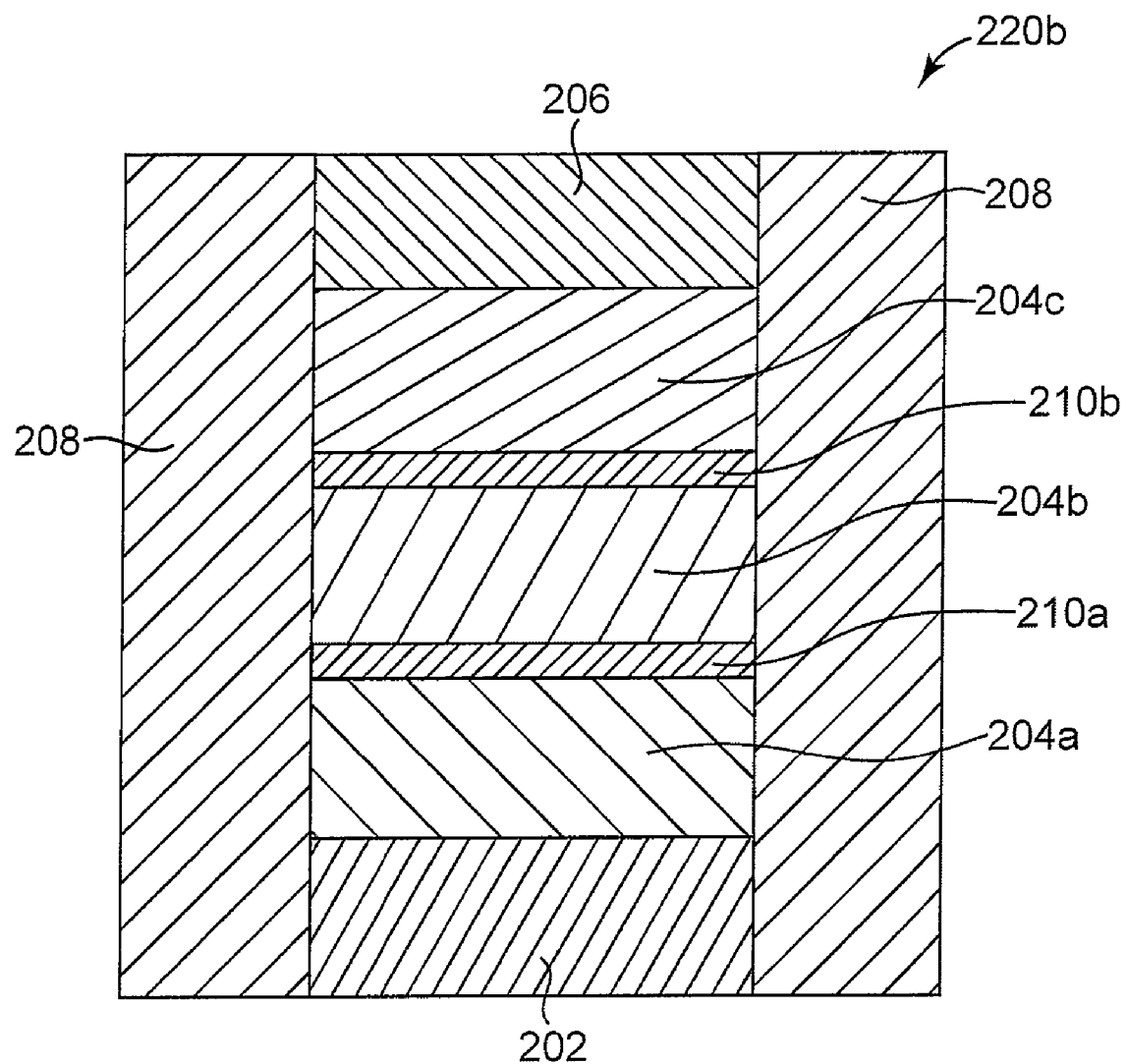
FIG. 3B illustrates a cross-sectional view of another embodiment of a phase change memory cell.

FIG. 3B illustrates a cross-sectional view of another embodiment of a phase change memory cell 220b. Phase change memory cell 220b includes a first electrode 202, a first phase change material layer 204a, a second phase change material layer 204b, a third phase change material layer 204c, a second electrode 206, insulation material 208, first diffusion barrier 210a, and second diffusion barrier 210b. First phase change material layer 204a is in contact with first electrode 202. First diffusion barrier 210a is in contact with first phase change material layer 204a. Second phase change material layer 204b is in contact with first diffusion barrier 210a. Second diffusion barrier 210b is in contact with second phase change material layer 204b. Third phase change material layer 204c is in contact with second diffusion barrier 210b and second electrode 206. First electrode 202, phase change material layers 204, second electrode 206, and diffusion barriers 210 are surrounded by insulation material 208.

Phase change memory cell 220b is similar to phase change memory cell 220a in composition and operation, except that phase change memory cell 220b includes diffusion barriers 210. Diffusion barriers 210 prevent diffusion between phase change material layers 204.

Figure 4A:
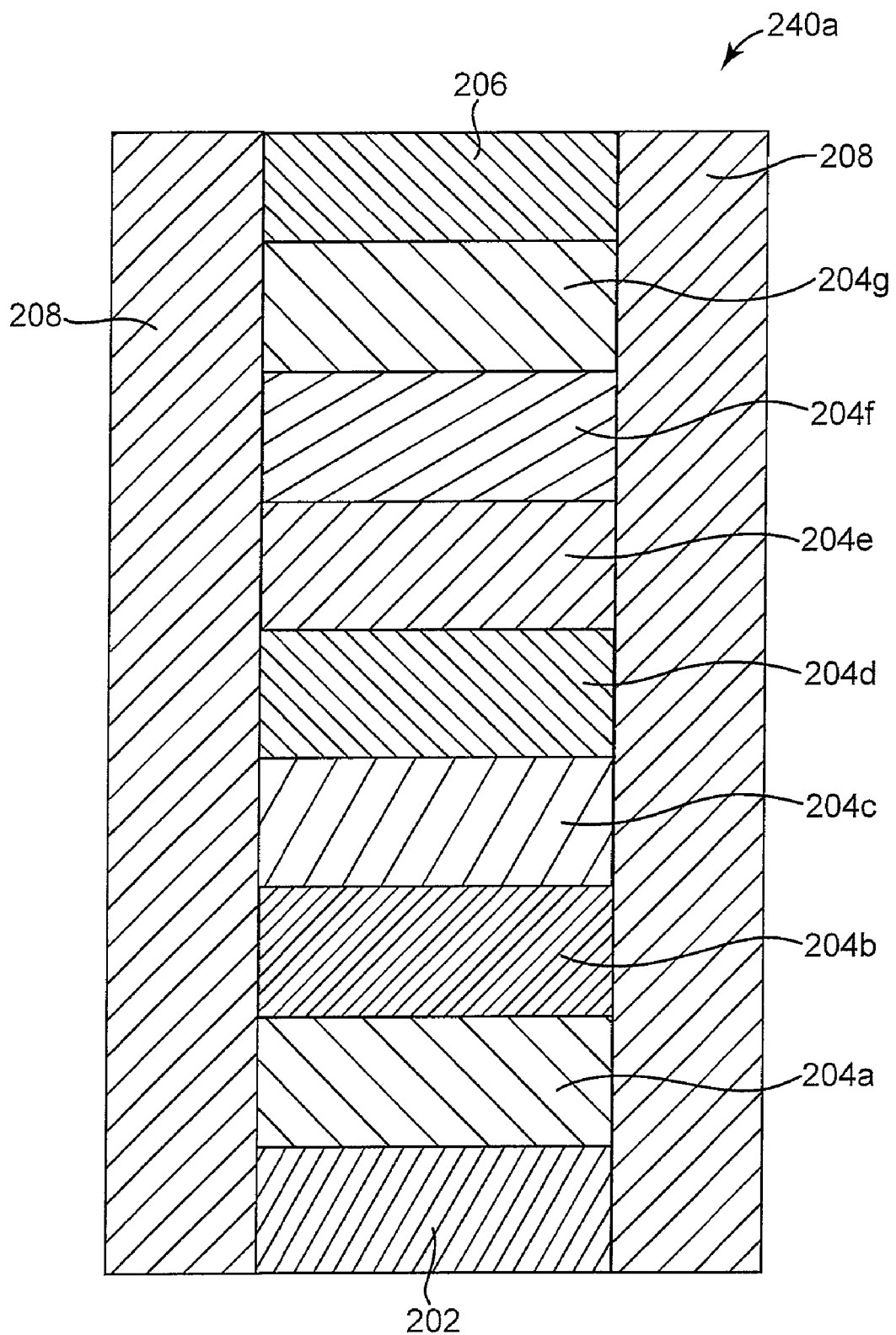
FIG. 4A illustrates a cross-sectional view of another embodiment of a phase change memory cell.

FIG. 4A illustrates a cross-sectional view of another embodiment of a phase change memory cell 240a. Phase change memory cell 240a includes a first electrode 202, a first phase change material layer 204a, a second phase change material layer 204b, a third phase change material layer 204c, a fourth phase change material layer 204d, a fifth phase change material layer 204e, a sixth phase change material layer 204f, a seventh phase change material layer 204g, a second electrode 206, and insulation material 208. First phase change material layer 204a is in contact with first electrode 202. Second phase change material layer 204b is in contact with first phase change material layer 204a. Third phase change material layer 204c is in contact with second phase change material layer 204b. Fourth phase change material layer 204d is in contact with third phase change material layer 204c. Fifth phase change material layer 204e is in contact with fourth phase change material layer 204d. Sixth phase change material layer 204f is in contact with fifth phase change material layer 204e. Seventh phase change material layer 204g is in contact with phase change material layer 204f and second electrode 206. First electrode 202, phase change material layers 204, and second electrode 206 are surrounded by insulation material 208.

Phase change material layers 204 have different crystallization speeds. In one embodiment, first phase change material layer 204a includes a phase change material with a first crystallization speed. Second phase change material layer 204b includes a phase change material with a second crystallization speed. Third phase change material layer 204c includes a phase change material with a third crystallization speed. Fourth phase change material layer 204d includes a phase change material with a fourth crystallization speed. Fifth phase change material layer 204e includes a phase change material with a fifth crystallization speed. Sixth phase change material layer 204f includes a phase change material with a sixth crystallization speed. Seventh phase change material layer 204g includes a phase change material with a seventh crystallization speed. The seventh crystallization speed is faster than the sixth crystallization speed. The sixth crystallization speed is faster than the fifth crystallization speed. The fifth crystallization speed is faster than the fourth crystallization speed. The fourth crystallization speed is faster than the third crystallization speed. The third crystallization speed is faster than the second crystallization speed. The second crystallization speed is faster than the first crystallization speed. In other embodiments, phase change material layers 204 are made up of any suitable order of phase change materials with the first, second, third, fourth, fifth, sixth, and seventh crystallization speeds.

A selection device such as an active device like a transistor or diode, is coupled to one of first electrode 202 or second electrode 206 to control the application of current or voltage pulses to the other of first electrode 202 or second electrode 206, and thus to phase change material layers 204, to set and reset phase change material layers 204. A first current or voltage pulse having a first amplitude and/or duration programs the phase change material with the seventh crystallization speed. A second current or voltage pulse having a second amplitude and/or duration programs the phase change material with the sixth crystallization speed. A third current or voltage pulse having a third amplitude and/or duration programs the phase change material with the fifth crystallization speed. A fourth current or voltage pulse having a fourth amplitude and/or duration programs the phase change material with the fourth crystallization speed. A fifth current or voltage pulse having a fifth amplitude and/or duration programs the phase change material with the third crystallization speed. A sixth current or voltage pulse having a sixth amplitude and/or duration programs the phase change material with the second crystallization speed. A seventh current or voltage pulse having a seventh amplitude and/or duration programs the phase change material with the first crystallization speed. The seventh amplitude and/or duration is greater than the sixth amplitude and/or duration. The sixth amplitude and/or duration is greater than the fifth amplitude and/or duration. The fifth amplitude and/or duration is greater than the fourth amplitude and/or duration. The fourth amplitude and/or duration is greater than the third amplitude and/or duration. The third amplitude and/or duration is greater than the second amplitude and/or duration. The second amplitude and/or duration is greater than the first amplitude and/or duration.

During operation of phase change memory cell 240a, current or voltage pulses are applied between first electrode 202 and second electrode 206 to program phase change memory cell 240a. In one embodiment, the first current or voltage pulse having the first amplitude and/or duration programs seventh phase change material layer 204g. The second current or voltage pulse having the second amplitude and/or duration programs sixth phase change material layer 204f. The third current or voltage pulse having the third amplitude and/or duration programs fifth phase change material layer 204e. The fourth current or voltage pulse having the fourth amplitude and/or duration programs fourth phase change material layer 204d. The fifth current or voltage pulse having the fifth amplitude and/or duration programs third phase change material layer 204c. The sixth current or voltage pulse having the sixth amplitude and/or duration programs second phase change material layer 204b. The seventh current or voltage pulse having the seventh amplitude and/or duration programs first phase change material layer 204a. In other embodiments, first, second, third, fourth, fifth, sixth, and seventh current or voltage pulses program any suitable order of phase change material layers 204, depending on the crystallization speed of the phase change material in each of phase change material layers 204.

By selectively programming phase change material layers 204, phase change memory cell 240a can be programmed to provide eight states in phase change material layers 204. In one embodiment, in a first state, phase change material layers 204 are amorphous. In a second state, seventh phase change material layer 204g is crystalline, and first through sixth phase change material layers 204a-204f are amorphous. In a third state, sixth and seventh phase change material layers 204f and 204g are crystalline, and first through fifth phase change material layers 204a-204e are amorphous. In a fourth state, fifth through seventh phase change material layers 204e-204g are crystalline, and first through fourth phase change material layers 204a-204d are amorphous. In a fifth state, fourth through seventh phase change material layers 204d-204g are crystalline, and first through third phase change material layers 204a-204c are amorphous. In a sixth state, third through seventh phase change material layers 204c-204g are crystalline, and first and second phase change material layers 204a and 204b are amorphous. In a seventh state, second through seventh phase change material layers 204b-204g are crystalline, and first phase change material layer 204a is amorphous. In an eighth state, phase change material layers 204 are crystalline.

In another embodiment, in a first state, phase change material layers 204 are crystalline. In a second state, seventh phase change material layer 204g is amorphous, and first through sixth phase change material layers 204a-204f are crystalline. In a third state, sixth and seventh phase change material layers 204f and 204g are amorphous, and first through fifth phase change material layers 204a-204e are crystalline. In a fourth state, fifth through seventh phase change material layers 204e-204g are amorphous, and first through fourth phase change material layers 204a-204d are crystalline. In a fifth state, fourth through seventh phase change material layers 204d-204g are amorphous, and first through third phase change material layers 204a-204c are crystalline. In a sixth state, third through seventh phase change material layers 204c-204g are amorphous, and first and second phase change material layers 204a and 204b are crystalline. In a seventh state, second through seventh phase change material layers 204b-204g are amorphous, and first phase change material layer 204a is crystalline. In an eighth state, phase change material layers 204 are amorphous. In other embodiments, each of phase change material layers 204 is programmed to be amorphous or crystalline in any suitable order, depending on the crystallization speed of the phase change material in each of phase change material layers 204. In other embodiments, any suitable number of phase change material layers 204 are used for obtaining a desired number of states in phase change memory cell 240a.

Figure 4B:
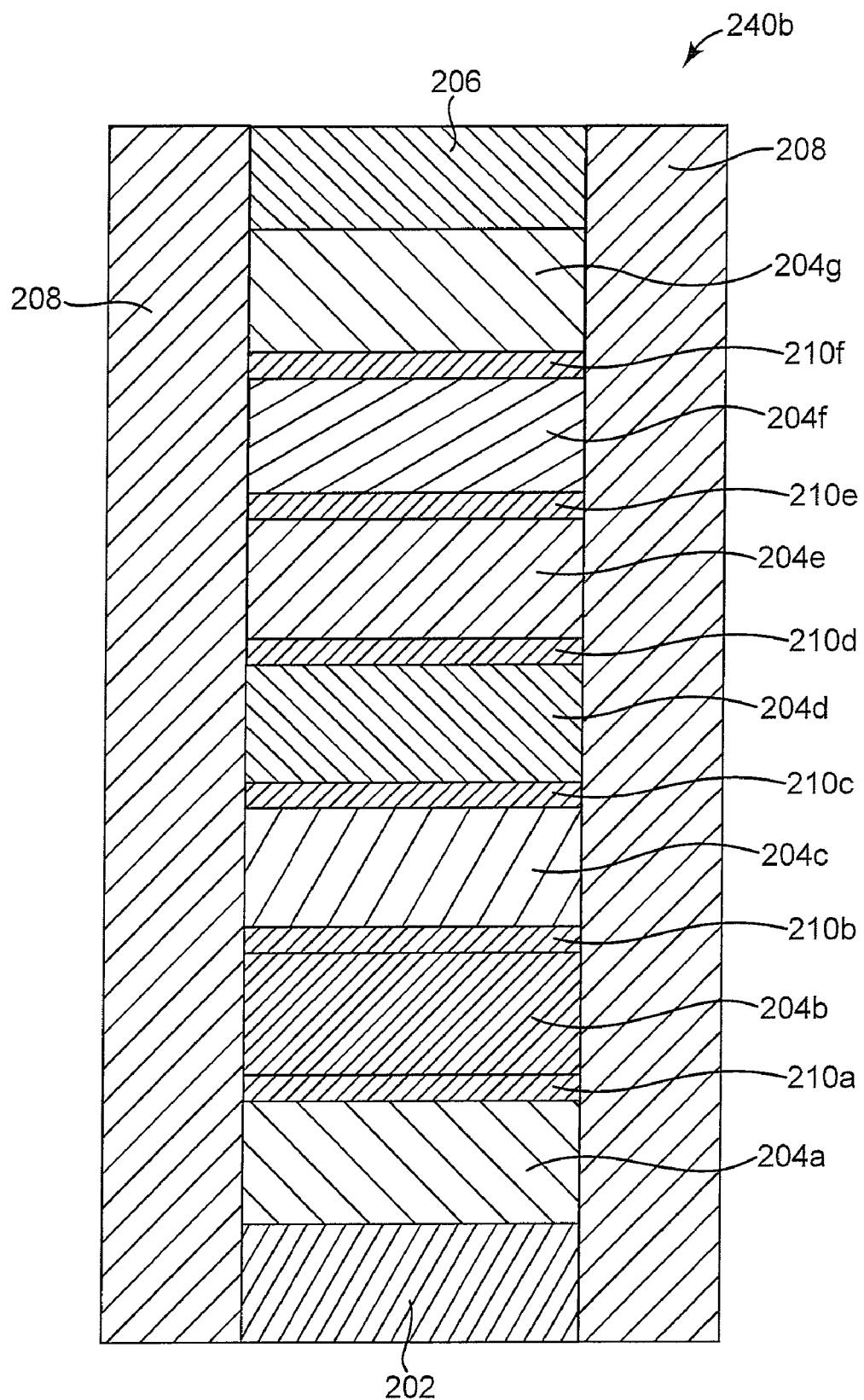
FIG. 4B illustrates a cross-sectional view of another embodiment of a phase change memory cell.

FIG. 4B illustrates a cross-sectional view of another embodiment of a phase change memory cell 240b. Phase change memory cell 240b includes a first electrode 202, a first phase change material layer 204a, a second phase change material layer 204b, a third phase change material layer 204c, a fourth phase change material layer 204d, a fifth phase change material layer 204e, a sixth phase change material layer 204f, a seventh phase change material layer 204g, a second electrode 206, insulation material 208, first diffusion barrier 210a, second diffusion barrier 210b, third diffusion barrier 210c, fourth diffusion barrier 210d, fifth diffusion barrier 210e, and sixth diffusion barrier 210f.

First phase change material layer 204a is in contact with first electrode 202. First diffusion barrier 210a is in contact with first phase change material layer 204a. Second phase change material layer 204b is in contact with first diffusion barrier 210a. Second diffusion barrier 210b is in contact with second phase change material layer 204b. Third phase change material layer 204c is in contact with second diffusion barrier 210b. Third diffusion barrier 210c is in contact with third phase change material 204c. Fourth phase change material layer 204d is in contact with third diffusion barrier 210c. Fourth diffusion barrier 210d is in contact with fourth phase change material layer 204d. Fifth phase change material layer 204e is in contact with fourth diffusion barrier 210d. Fifth diffusion barrier 210e is in contact with fifth phase change material layer 204e. Sixth phase change material layer 204f is in contact with fifth diffusion barrier 210e. Sixth diffusion barrier 210f is in contact with sixth phase change material layer 204f. Seventh phase change material layer 204g is in contact with sixth diffusion barrier 210f and second electrode 206. First electrode 202, phase change material layers 204, second electrode 206, and diffusion barriers 210 are surrounded by insulation material 208.

Phase change memory cell 240b is similar to phase change memory cell 240a in composition and operation, except that phase change memory cell 240b includes diffusion barriers 210. Diffusion barriers 210 prevent diffusion between phase change material layers 204.

Figure 5A:
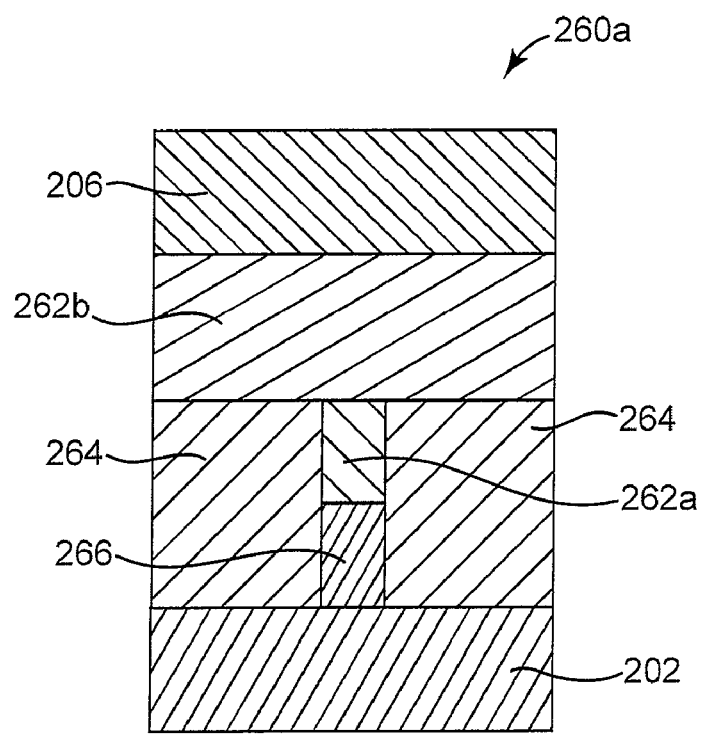
FIG. 5A illustrates a cross-sectional view of another embodiment of a phase change memory cell.

FIG. 5A illustrates a cross-sectional view of another embodiment of a phase change memory cell 260a. Phase change memory cell 260a includes a first electrode 202, a first phase change material layer 262a, a second phase change material layer 262b, a second electrode 206, insulation material 264, and heater material 266. Heater material 266 is in contact with first electrode 202. First phase change material layer 262a is in contact with heater material 266. Insulation material 264 surrounds heater material 266 and first phase change material layer 262a. Second phase change material 262b is in contact with first phase change material 262a, insulation material 264, and second electrode 206. First phase change material layer 262a has a narrower cross-section than second phase change material layer 262b. First phase change material layer 262a and heater material 266 have substantially the same cross-sectional width.

Heater material 266 provides controllable heating of first phase change material layer 262a, thereby providing controllable phase change within first phase change material layer 262a. Heater material 266 includes any suitable heater material, such as TiN, TaN, WN, TaSiN, TiSiN, TiAlN or C.

First phase change material layer 262a and second phase change material layer 262b have different crystallization speeds. In one embodiment, first phase change material layer 262a includes a phase change material with slower crystallization speed than second phase change material layer 262b. In another embodiment, first phase change material layer 262a includes a phase change material with faster crystallization speed than second phase change material layer 262b.

A selection device such as an active device like a transistor or diode, is coupled to one of first electrode 202 or second electrode 206 to control the application of current or voltage pulses to the other of first electrode 202 or second electrode 206, and thus to phase change material layers 262, to set and reset phase change material layers 262. If first phase change material layer 262a has a faster crystallization speed than second phase change material layer 262b, then a current or voltage pulse having a lower amplitude and/or duration is used to program first phase change material layer 262a than to program second phase change material layer 262b. If second phase change material layer 262b has a faster crystallization speed than first phase change material layer 262a, then a current or voltage pulse having a lower amplitude and/or duration is used to program second phase change material layer 262b than to program first phase change material layer 262a.

During operation of phase change memory cell 260a, current or voltage pulses are applied between first electrode 202 and second electrode 206 to program phase change memory cell 260a. In one embodiment, a first current or voltage pulse having a first amplitude and/or duration programs second phase change material layer 262b. A second current or voltage pulse having a second amplitude and/or duration programs first phase change material layer 262a. In another embodiment, the first current or voltage pulse having the first amplitude and/or duration programs first phase change material layer 262a. The second current or voltage pulse having the second amplitude and/or duration programs second phase change material layer 262b. The second amplitude and/or duration is greater than the first amplitude and/or duration.

By selectively programming phase change material layers 262, phase change memory cell 260a can be programmed to provide three states in phase change material layers 262. In one embodiment, in a first state, phase change material layers 262 are amorphous. In a second state, second phase change material layer 262b is crystalline, and first phase change material layer 262a is amorphous. In a third state, phase change material layers 262 are crystalline. In another embodiment, in a first state, phase change material layers 262 are amorphous. In a second state, first phase change material layer 262a is crystalline, and second phase change material layer 262b is amorphous. In a third state, phase change material layers 262 are crystalline. In another embodiment, in a first state, phase change material layers 262 are crystalline. In a second state, second phase change material layer 262b is amorphous, and first phase change material layer 262a is crystalline. In a third state, phase change material layers 262 are amorphous. In another embodiment, in a first state, phase change material layers 262 are crystalline. In a second state, first phase change material layer 262a is amorphous, and second phase change material layer 262b is crystalline. In a third state, phase change material layers 262 are amorphous. In other embodiments, any suitable number of phase change material layers 262 are used for obtaining a desired number of states in phase change memory cell 260a.

Figure 5B:
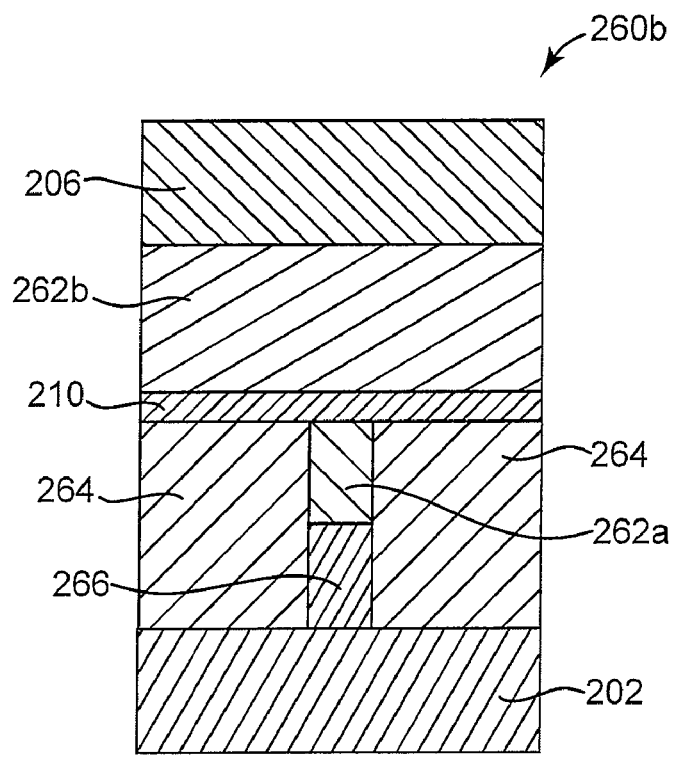
FIG. 5B illustrates a cross-sectional view of another embodiment of a phase change memory cell.

FIG. 5B illustrates a cross-sectional view of another embodiment of a phase change memory cell 260b. Phase change memory cell 260b includes a first electrode 202, a first phase change material layer 262a, a second phase change material layer 262b, a second electrode 206, insulation material 264, diffusion barrier 210, and heater material 266. Heater material 266 is in contact with first electrode 202. First phase change material layer 262a is in contact with heater material 266. Insulation material 264 surrounds heater material 266 and first phase change material layer 262a. Diffusion barrier 210 is in contact with first phase change material 262a, and insulation material 264. Second phase change material 262b is in contact with diffusion barrier 210 and second electrode 206.

Phase change memory cell 260b is similar to phase change memory cell 260a in composition and operation, except that phase change memory cell 260b includes diffusion barrier 210. Diffusion barrier 210 prevents diffusion between phase change material layers 262.

Figure 5C:
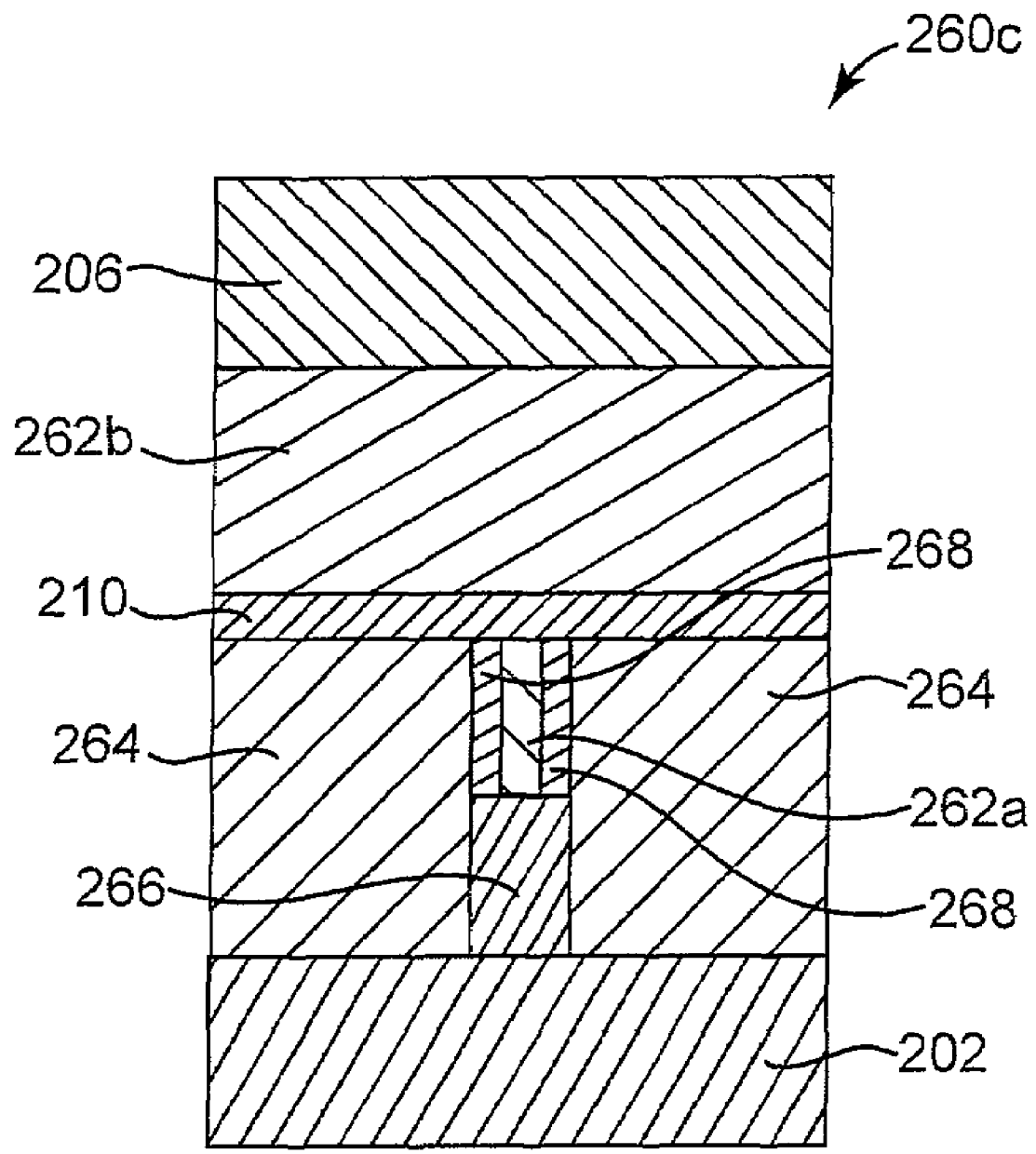
FIG. 5C illustrates a cross-sectional view of another embodiment of a phase change memory cell.

FIG. 5C illustrates a cross-sectional view of another embodiment of a phase change memory cell 260c. Phase change memory cell 260c includes a first electrode 202, a first phase change material layer 262a, a second phase change material layer 262b, a second electrode 206, insulation material 264, diffusion barrier 210, heater material 266, and shunt resistors 268. Heater material 266 is in contact with first electrode 202. First phase change material layer 262a is in contact with heater material 266. Shunt resistors 268 are in contact with first phase change material layer 262a and heater material 266. Insulation material 264 surrounds heater material 266 and shunt resistors 268. Diffusion barrier 210 is in contact with first phase change material 262a, insulation material 264, and shunt resistors 268. Second phase change material 262b is in contact with diffusion barrier 210 and second electrode 206.

Phase change memory cell 260c is similar to phase change memory cell 260b in composition and operation, except that phase change memory cell 260c includes shunt resistors 268. Shunt resistors 268 limit the resistance of first phase change material layer 204b.

Figure 6A:
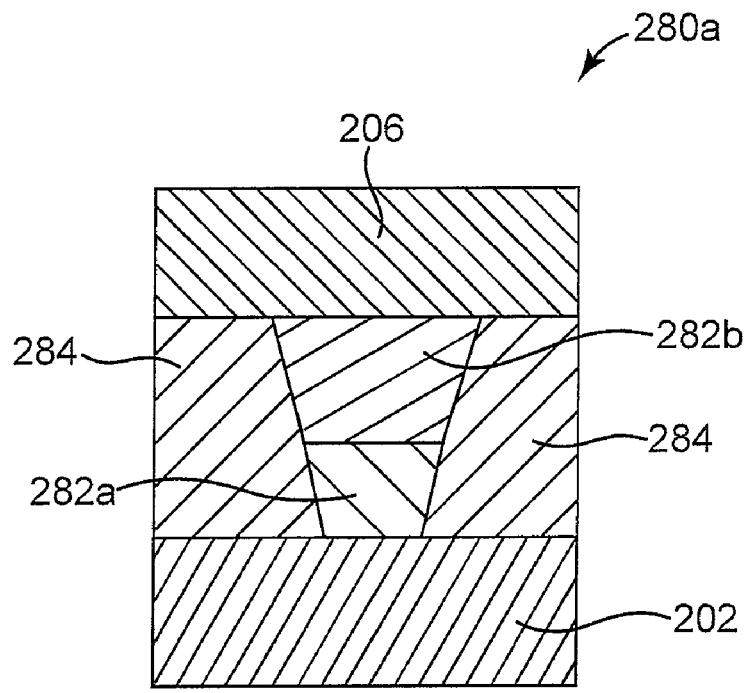
FIG. 6A illustrates a cross-sectional view of another embodiment of a phase change memory cell.

FIG. 6A illustrates a cross-sectional view of another embodiment of a phase change memory cell 280a. Phase change memory cell 280a includes a first electrode 202, a first phase change material layer 282a, a second phase change material layer 282b, a second electrode 206, and insulation material 284. First phase change material layer 282a is in contact with first electrode 202. Second phase change material layer 282b is in contact with first phase change material layer 282a. Insulation material 284 surrounds first phase change material layer 282a and second phase change material layer 282b. Second electrode 206 is in contact with second phase change material layer 282b and insulation material 284. First phase change material layer 282a and second phase change material layer 282b are tapered.

First phase change material layer 282a and second phase change material layer 282b have different crystallization speeds. In one embodiment, first phase change material layer 282a includes a phase change material having a slower crystallization speed than second phase change material layer 282b. In another embodiment, first phase change material layer 282a includes a phase change material having faster crystallization speed than second phase change material layer 282b.

A selection device such as an active device like a transistor or diode, is coupled to one of first electrode 202 or second electrode 206 to control the application of current or voltage pulses to the other of first electrode 202 or second electrode 206, and thus to phase change material layers 282, to set and reset phase change material layers 282. If first phase change material layer 282a has a faster crystallization speed than second phase change material layer 282b, then a current or voltage pulse having a lower amplitude and/or duration is used to program first phase change material layer 282a than to program second phase change material layer 282b. If second phase change material layer 282b has a faster crystallization speed than first phase change material layer 282a, then a current or voltage pulse having a lower amplitude and/or duration is used to program second phase change material layer 282b than to program first phase change material layer 282a.

During operation of phase change memory cell 280a, current or voltage pulses are applied between first electrode 202 and second electrode 206 to program phase change memory cell 280a. In one embodiment, a first current or voltage pulse having a first amplitude and/or duration programs second phase change material layer 282b. A second current or voltage pulse having a second amplitude and/or duration programs first phase change material layer 282a. In another embodiment, the first current or voltage pulse having the first amplitude and/or duration programs first phase change material layer 282a. The second current or voltage pulse having the second amplitude and/or duration programs second phase change material layer 282b. The second amplitude and/or duration is greater than the first amplitude and/or duration.

By selectively programming phase change material layers 282, phase change memory cell 280a can be programmed to provide three states in phase change material layers 282. In one embodiment, in a first state, phase change material layers 282 are amorphous. In a second state, second phase change material layer 282b is crystalline, and first phase change material layer 282a is amorphous. In a third state, phase change material layers 282 are crystalline. In another embodiment, in a first state, phase change material layers 282 are amorphous. In a second state, first phase change material layer 282a is crystalline, and second phase change material layer 282b is amorphous. In a third state, phase change material layers 282 are crystalline. In another embodiment, in a first state, phase change material layers 282 are crystalline. In a second state, second phase change material layer 282b is amorphous, and first phase change material layer 282a is crystalline. In a third state, phase change material layers 282 are amorphous. In another embodiment, in a first state, phase change material layers 282 are crystalline. In a second state, first phase change material layer 282a is amorphous, and second phase change material layer 282b is crystalline. In a third state, phase change material layers 282 are amorphous. In other embodiments, any suitable number of phase change material layers 282 are used for obtaining a desired number of states in phase change memory cell 280a.

Figure 6B:
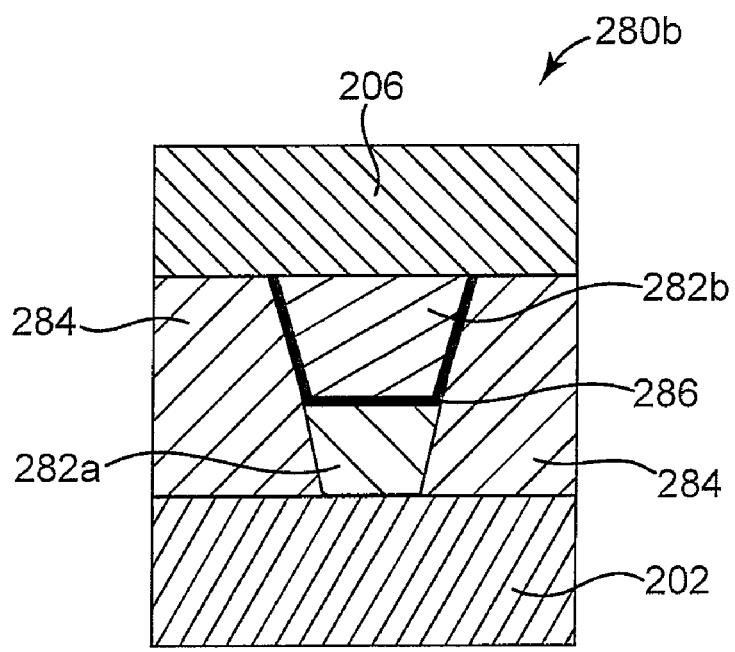
FIG. 6B illustrates a cross-sectional view of another embodiment of a phase change memory cell.

FIG. 6B illustrates a cross-sectional view of another embodiment of a phase change memory cell 280b. Phase change memory cell 280b includes a first electrode 202, a first phase change material layer 282a, a second phase change material layer 282b, a second electrode 206, insulation material 284, and diffusion barrier 286. First phase change material layer 282a is in contact with first electrode 202. Diffusion barrier 286 is in contact with first phase change material layer 282a and second phase change material layer 282b. Insulation material 284 surrounds first phase change material 282a and diffusion barrier 286. Second electrode 206 is in contact with insulation material 284, diffusion barrier 286, and second phase change material 282b.

Phase change memory cell 280b is similar to phase change memory cell 280a in composition and operation, except that phase change memory cell 280b includes diffusion barrier 286. Diffusion barrier 282 prevents diffusion between phase change material layers 204.

Figure 6C:
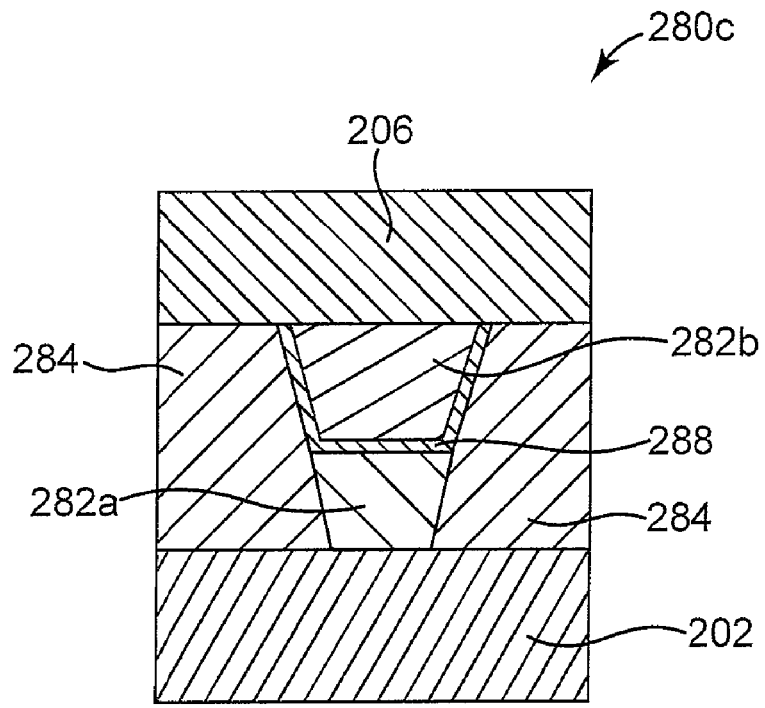
FIG. 6C illustrates a cross-sectional view of another embodiment of a phase change memory cell.

FIG. 6C illustrates a cross-sectional view of another embodiment of a phase change memory cell 280c. Phase change memory cell 280c includes a first electrode 202, a first phase change material layer 282a, a second phase change material layer 282b, a second electrode 206, insulation material 284, and shunt resistor 288. First phase change material layer 282a is in contact with first electrode 202. Shunt resistor 288 is in contact with first phase change material layer 282a and second phase change material layer 282b. Insulation material 284 surrounds first phase change material 282a and shunt resistor 288. Second electrode 206 is in contact with insulation material 284, shunt resistor 288, and second phase change material 282b.

Phase change memory cell 280c is similar to phase change memory cell 280a in composition and operation, except that phase change memory cell 280c includes shunt resistor 288. Shunt resistor 288 limits the resistance of second phase change material layer 282b.

Figure 6D:
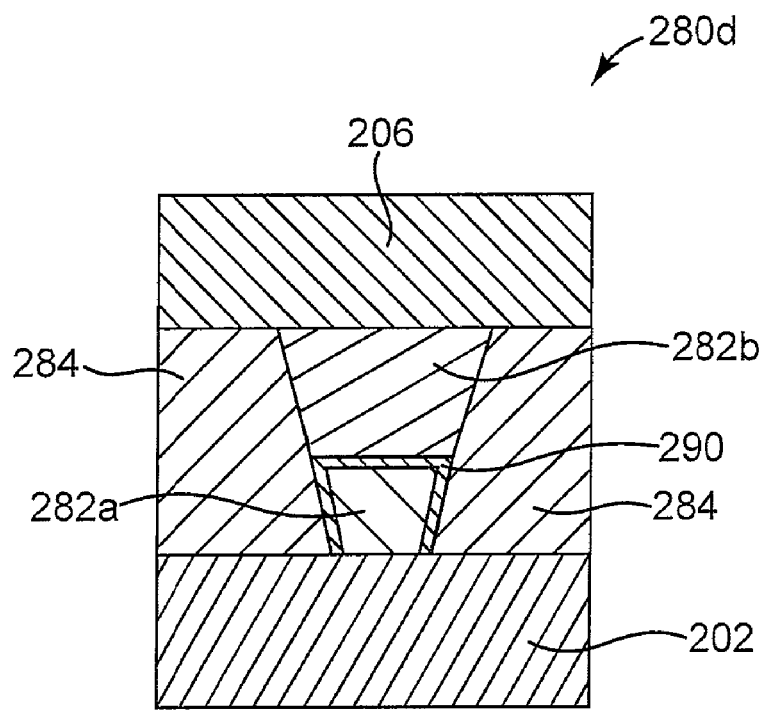
FIG. 6D illustrates a cross-sectional view of another embodiment of a phase change memory cell.

FIG. 6D illustrates a cross-sectional view of another embodiment of a phase change memory cell 280d. Phase change memory cell 280d includes a first electrode 202, a first phase change material layer 282a, a second phase change material layer 282b, a second electrode 206, insulation material 284, and shunt resistor 290. First phase change material layer 282a is in contact with first electrode 202. Shunt resistor 290 is in contact with first phase change material layer 282a and second phase change material layer 282b. Insulation material 284 surrounds second phase change material 282b and shunt resistor 290. Second electrode 206 is in contact with insulation material 284 and second phase change material 282b.

Phase change memory cell 280b is similar to phase change memory cell 280a in composition and operation, except that phase change memory cell 280d includes shunt resistor 290. Shunt resistor 290 limits the resistance of first phase change material layer 204b.

Figure 6E:
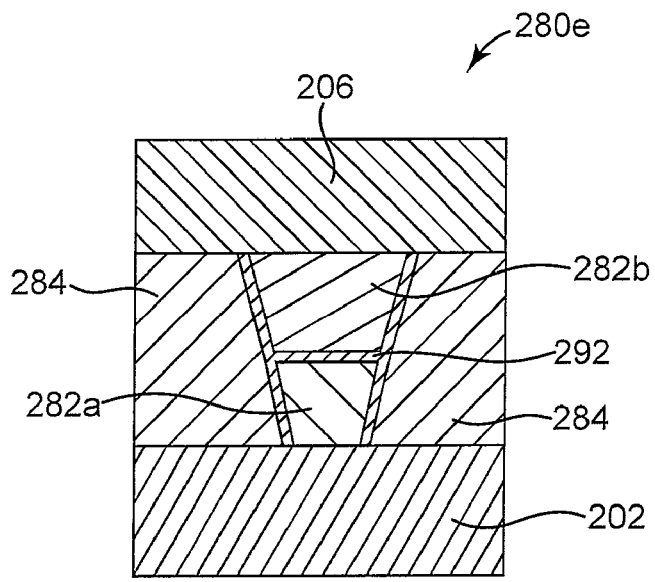
FIG. 6E illustrates a cross-sectional view of another embodiment of a phase change memory cell.

FIG. 6E illustrates a cross-sectional view of another embodiment of a phase change memory cell 280e. Phase change memory cell 280e includes a first electrode 202, a first phase change material layer 282a, a second phase change material layer 282b, a second electrode 206, insulation material 284, and shunt resistor 292. First phase change material layer 282a is in contact with first electrode 202. Shunt resistor 292 is in contact with first phase change material layer 282a and second phase change material layer 282b. Insulation material 284 surrounds shunt resistor 292. Second electrode 206 is in contact with insulation material 284, shunt resistor 292, and second phase change material 282b.

Phase change memory cell 280e is similar to phase change memory cell 280a in composition and operation, except that phase change memory cell 280e includes shunt resistor 292. Shunt resistor 292 limits the resistance of phase change material layers 282.

Figure 7A:
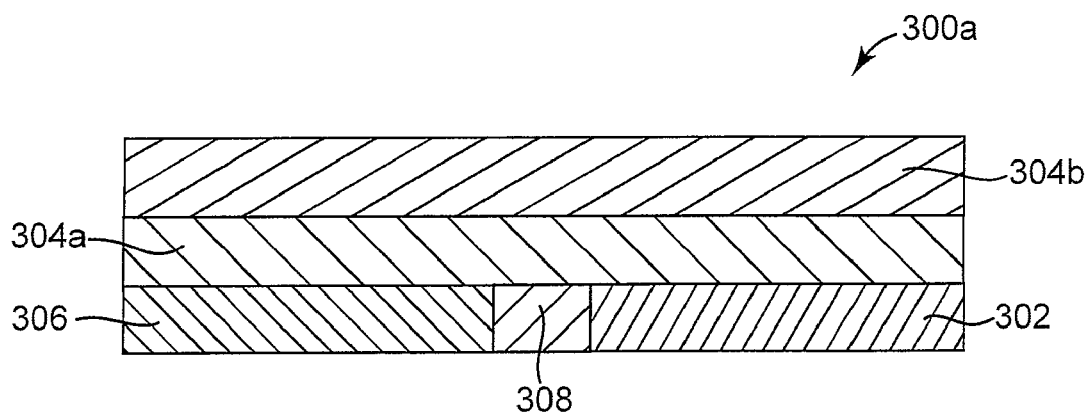
FIG. 7A illustrates a cross-sectional view of another embodiment of a phase change memory cell.

FIG. 7A illustrates a cross-sectional view of another embodiment of a phase change memory cell 300a. Phase change memory cell 300a includes a first electrode 302, a first phase change material layer 304a, a second phase change material layer 304b, a second electrode 306, and insulation material 308. Insulation material 308 is in contact with first electrode 302 and second electrode 306. First phase change material layer 304a is in contact with first electrode 302, second electrode 306, insulation material 308, and second phase change material layer 304b.

First phase change material layer 304a and second phase change material layer 304b have different crystallization speeds. In one embodiment, first phase change material layer 304a includes a phase change material having a slower crystallization speed than second phase change material layer 304b. In another embodiment, first phase change material layer 304a includes a phase change material having a faster crystallization speed than second phase change material layer 304b.

A selection device such as an active device like a transistor or diode, is coupled to one of first electrode 202 or second electrode 206 to control the application of current or voltage pulses to the other of first electrode 202 or second electrode 206, and thus to phase change material layers 304, to set and reset phase change material layers 304. If first phase change material layer 304a has a faster crystallization speed than second phase change material layer 304b, then a current or voltage pulse having a lower amplitude and/or duration is used to program first phase change material layer 304a than to program second phase change material layer 304b. If second phase change material layer 304b has a faster crystallization speed than first phase change material layer 304a, then a current or voltage pulse having a lower amplitude and/or duration is used to program second phase change material layer 304b than to program first phase change material layer 304a.

During operation of phase change memory cell 300a, current or voltage pulses are applied between first electrode 202 and second electrode 206 to program phase change memory cell 300a. In one embodiment, a first current or voltage pulse having a first amplitude and/or duration programs second phase change material layer 304b. A second current or voltage pulse having a second amplitude and/or duration programs first phase change material layer 304a. In another embodiment, the first current or voltage pulse having the first amplitude and/or duration programs first phase change material layer 304a. The second current or voltage pulse having the second amplitude and/or duration programs second phase change material layer 304b. The second amplitude and/or duration is greater than the first amplitude and/or duration.

By selectively programming phase change material layers 304, phase change memory cell 300a can be programmed to provide three states in phase change material layers 304. In one embodiment, in a first state, phase change material layers 304 are amorphous. In a second state, second phase change material layer 304b is crystalline and first phase change material layer 304a is amorphous. In a third state, phase change material layers 304 are crystalline. In another embodiment, in a first state, phase change material layers 304 are amorphous. In a second state, first phase change material layer 304a is crystalline, and second phase change material layer 304b is amorphous. In a third state, phase change material layers 304 are crystalline. In another embodiment, in a first state, phase change material layers 304 are crystalline. In a second state, second phase change material layer 304b is amorphous, and first phase change material layer 304a is crystalline. In a third state, phase change material layers 304 are amorphous. In another embodiment, in a first state, phase change material layers 304 are crystalline. In a second state, first phase change material layer 304a is amorphous, and second phase change material layer 304b is crystalline. In a third state, phase change material layers 304 are amorphous. In other embodiments, any suitable number of phase change material layers 304 are used for obtaining a desired number of states in phase change memory cell 300a.

Figure 7B:
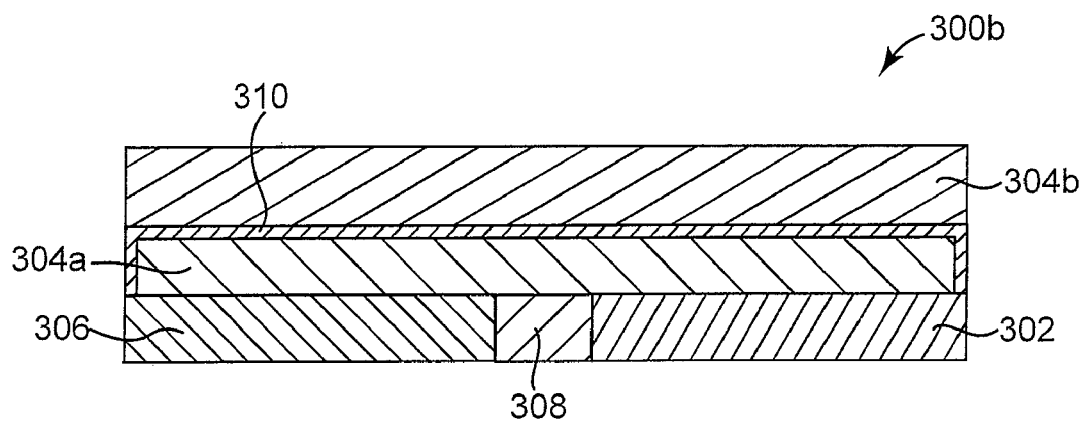
FIG. 7B illustrates a cross-sectional view of another embodiment of a phase change memory cell.

FIG. 7B illustrates a cross-sectional view of another embodiment of a phase change memory cell 300b. Phase change memory cell 300b includes a first electrode 302, a first phase change material layer 304a, a second phase change material layer 304b, a second electrode 306, insulation material 308, and diffusion barrier 310. Insulation material 308 is in contact with first electrode 302 and second electrode 306. First phase change material layer 304a is in contact with first electrode 302, second electrode 306, and insulation material 308. Diffusion barrier 310 is in contact with first electrode 302, second electrode 306, first phase change material layer 304a, and second phase change material layer 304b.

Phase change memory cell 300b is similar to phase change memory cell 300a in composition and operation, except that phase change memory cell 300b includes diffusion barrier 310. Diffusion barrier 310 prevents diffusion between phase change material layers 304.

Figure 8A:
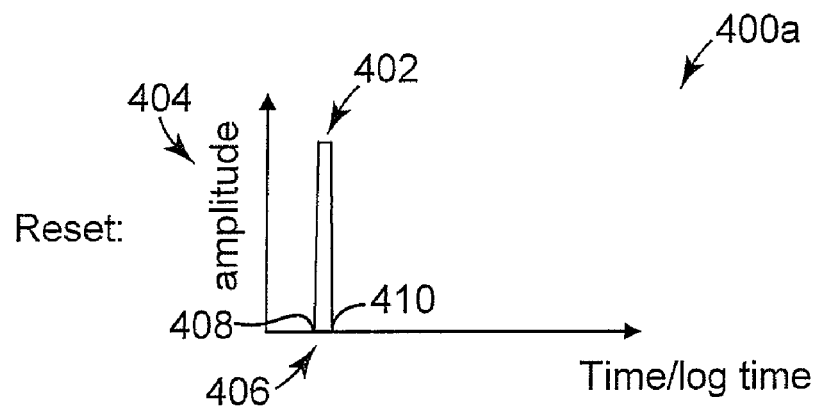
FIG. 8A is a timing diagram illustrating one embodiment of a reset pulse for programming a phase change memory cell.

FIG. 8A is a timing diagram 400a illustrating one embodiment of a reset pulse 402 for programming a phase change memory cell, such as phase change memory cell 200, 220, 240, 260, 280, or 300. Timing diagram 400a includes time/log time on x-axis 406 and pulse amplitude on y-axis 404. Reset pulse 402 begins at 408 and ends at 410.

To program a selected phase change memory cell to one of three resistance states, write circuit 102 generates a current or voltage pulse for heating at least one of a first phase change material layer and a second phase change material layer.

Write circuit 102 generates reset pulse 402 to program the selected phase change memory cell to a first state. Reset pulse 402 programs the first phase change material layer and the second phase change material layer to an amorphous state.

Figure 8B:
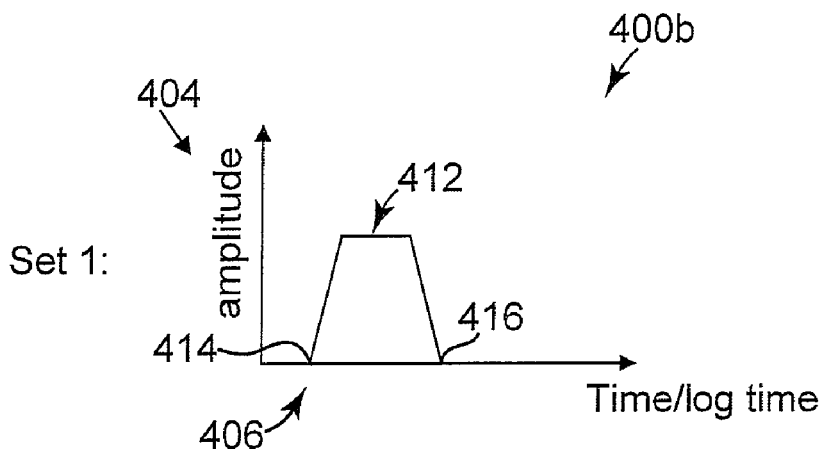
FIG. 8B is a timing diagram illustrating one embodiment of a first set pulse for programming the phase change memory cell.

FIG. 8B is a timing diagram 400b illustrating one embodiment of a first set pulse 412 for programming a selected phase change memory cell. Timing diagram 400b includes time/log time on x-axis 406 and pulse amplitude on y-axis 404. First set pulse 412 begins at 414 and ends at 416. First set pulse 412 has a lower amplitude and a larger pulse width than reset pulse 402.

Write circuit 102 generates first set pulse 412 to program the selected phase change memory cell to a second state. First set pulse 412 programs a selected phase change material layer with the faster crystallization speed. If a first phase change material layer has a faster crystallization speed than a second phase change material layer, then first set pulse 412 programs the first phase change material layer to a crystalline state. If the second phase change material layer has a faster crystallization speed than the first phase change material layer, then first set pulse 412 programs the second phase change material layer to a crystalline state.

Figure 8C:
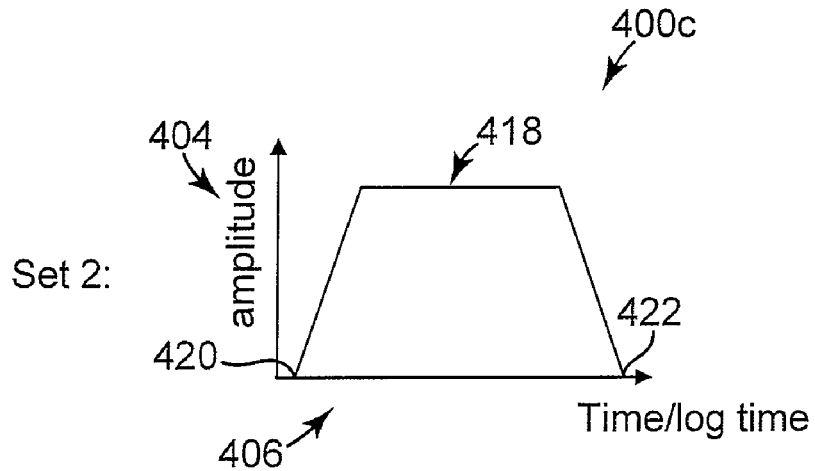
FIG. 8C is a timing diagram illustrating one embodiment of a second set pulse for programming the phase change memory cell.

FIG. 8C is a timing diagram 400c illustrating one embodiment of a second set pulse 418 for programming a selected phase change memory cell. Timing diagram 400c includes time/log time on x-axis 406 and pulse amplitude on y-axis 404. Second set pulse 418 begins at 420 and ends at 422. Second set pulse 418 has a larger pulse width than reset pulse 402. Second set pulse 418 also has a higher, lower, or equal amplitude and a larger pulse width than first set pulse 412.

Write circuit 102 generates second set pulse 418 to program the selected phase change memory cell to a third state. Second set pulse 418 programs a first phase change material layer and a second phase change material layer to a crystalline state.

Figure 8D:
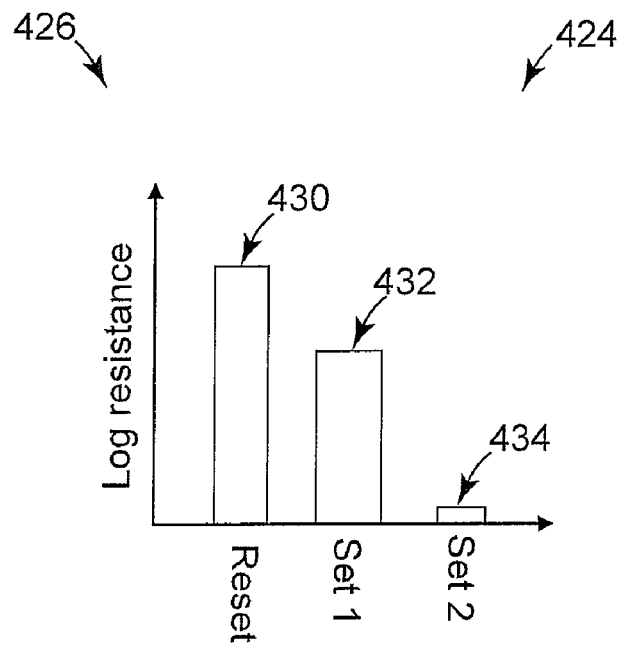
FIG. 8D is a chart illustrating one embodiment of the resistance of a phase change memory cell in response to the reset pulse, first set pulse and second set pulse.

FIG. 8D is a chart 424 illustrates one embodiment of the resistance 426 of a phase change memory cell, such as phase change memory cell 200a, 200b, 220, 240, 260a, 260b, 280a, 280b, or 300, in response to reset pulse 402, first set pulse 412, and second set pulse 418. The resistance corresponding to reset pulse 402 is shown at 430. The resistance corresponding to first set pulse 412 is shown at 432. The resistance corresponding to second set pulse 418 is shown at 434. Resistance 430 is higher than resistance 432. Resistance 432 is higher than resistance 434. Resistances 430, 432, and 434 are such that three distinct resistance layers of the phase change memory cell are reliably achieved.

Figure 8E:
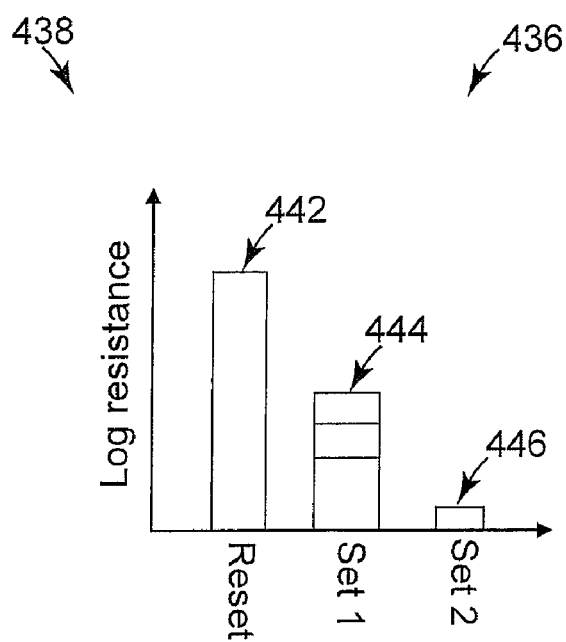
FIG. 8E is a chart illustrating one embodiment of the resistance of a phase change memory cell in response to the reset pulse, first set pulse, and second set pulse.

FIG. 8E is a chart 436 illustrating one embodiment of the resistance 438 of a phase change memory cell, such as phase change memory 200c, 200d, 200e, 260c, 280c, 280d, or 280e, in response to of reset pulse 402, first set pulse 412, and second set pulse 418 on phase change memory cell 200c. The resistance corresponding to reset pulse 402 is shown at 442. The resistance corresponding to first set pulse 412 is shown at 444. The resistance corresponding to second set pulse 418 is shown at 446. Resistance 442 is higher than resistance 444. Resistance 444 is higher than resistance 446. Resistances 442, 444, and 446 are such that three distinct resistance layers of the phase change memory cell are reliably achieved. Shunt resistors 212 reduces resistance 444 of first set pulse 412.

Figure 9A:
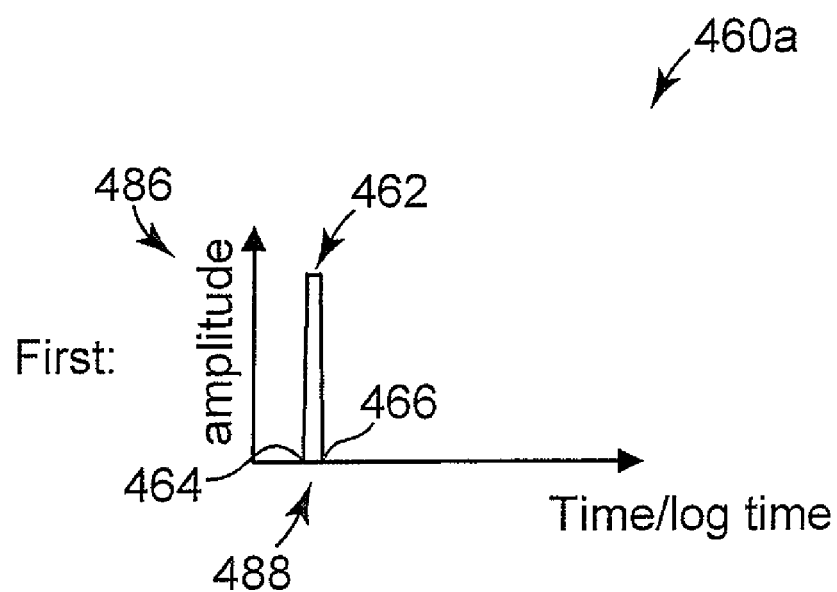
FIG. 9A is a timing diagram illustrating one embodiment of a first pulse for programming a phase change memory cell.
Figure 9B:
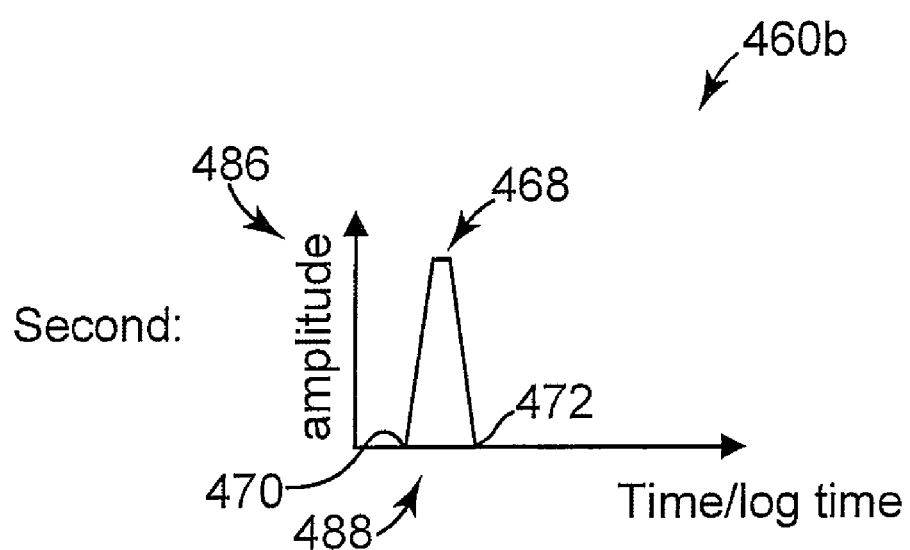
FIG. 9B is a timing diagram illustrating one embodiment of a second pulse for programming a phase change memory cell.
Figure 9C:
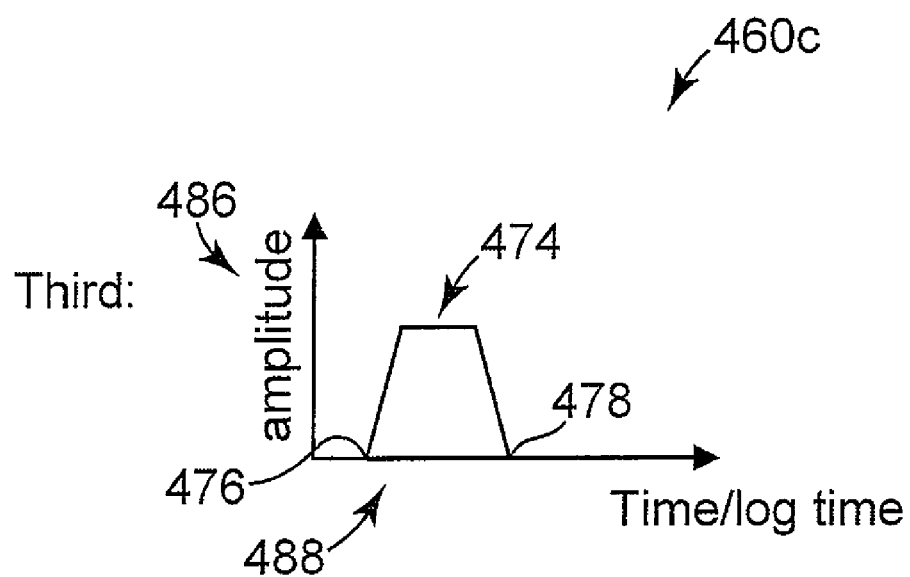
FIG. 9C is a timing diagram illustrating one embodiment of a third pulse for programming a phase change memory cell.
Figure 9D:
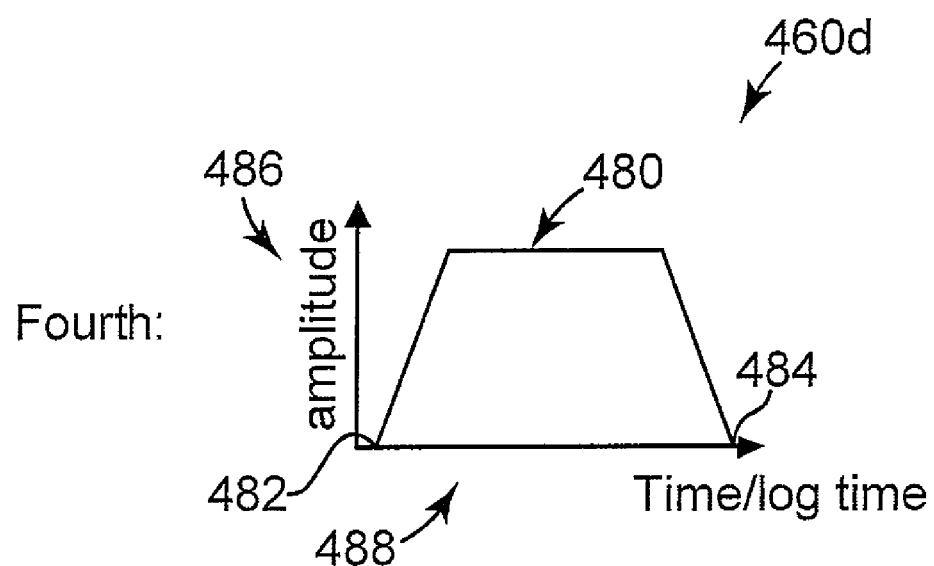
FIG. 9D is a timing diagram illustrating one embodiment of a fourth pulse for programming a phase change memory cell.

FIG. 9A is a timing diagram 460a illustrating one embodiment of a first pulse 462 for programming a phase change memory cell, such as phase change memory 200, 220, 240, 260, 280, or 300. FIG. 9B is a timing diagram 460b illustrating one embodiment of a second pulse 468 for programming a phase change memory cell. FIG. 9C is a timing diagram 460c illustrating one embodiment of a third pulse 474 for programming a phase change memory cell. FIG. 9D is a timing diagram 460d illustrating one embodiment of a fourth pulse 480 for programming a phase change memory cell.

Timing diagrams 460 include time/log time on x-axis 488 and pulse amplitude on y-axis 486. First pulse 462 begins at 464 and ends at 466. Second pulse 468 begins at 470 and ends at 472. Third pulse 474 begins at 476 and ends at 478. Fourth pulse 480 begins at 482 and ends at 484.

First pulse 462 is similar to reset pulse 402 previously described and illustrated with reference to FIG. 8A. Third pulse 474 is similar to first set pulse 412 previously described and illustrated with reference to FIG. 8B. Fourth pulse 480 is similar to second set pulse 418 previously described and illustrated with reference to FIG. 8C. Second pulse 468 performs the operation of reset pulse 402 and first set pulse 412.

To program a selected phase change memory cell to one of three resistance states, write circuit 102 generates a current or voltage pulse for heating at least one of a first phase change material layer and a second phase change material layer. In a first embodiment involving direct overwrite, write circuit 102 generates first pulse 462 to program the selected phase change memory cell to a first state. Write circuit 102 generates first pulse 462 and third pulse 474 or generates second pulse 468 to program the selected phase change memory cell to the second state. Write circuit 102 generates fourth pulse 480 to program the selected phase change memory cell to a third state. Direct overwrite refers to the process of programming the selected phase change memory cell without first erasing any pre-existing data.

In a second embodiment involving block erase, write circuit 102 generates fourth pulse 480 to block erase the selected phase change memory cell. The selected phase change memory cell begins in a first state. Write circuit 102 generates first pulse 462 to program the selected phase change memory cell to a second state. Write circuit 102 generates first pulse 462 and third pulse 474 or generates second pulse 468 to program the selected phase change memory cell to the third state. Block erase refers to the process of erasing any pre-existing data from the selected phase change memory cell prior to programming.

In a third embodiment involving block erase, write circuit 102 generates first pulse 462 to block erase the selected phase change memory cell. The selected phase change memory cell begins in a first state. Write circuit 102 generates third pulse 474 to program the selected phase change memory cell to a second state. Write circuit generates fourth pulse 480 to program the selected phase change memory cell to a third state.

Figure 10A:
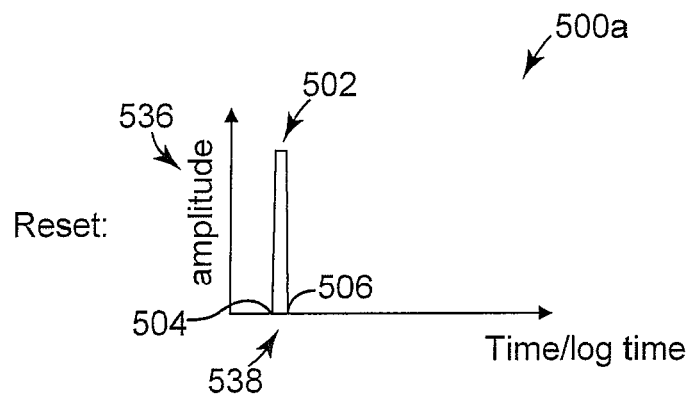
FIG. 10A is a timing diagram illustrating one embodiment of a reset pulse for programming a phase change memory cell.
Figure 10B:
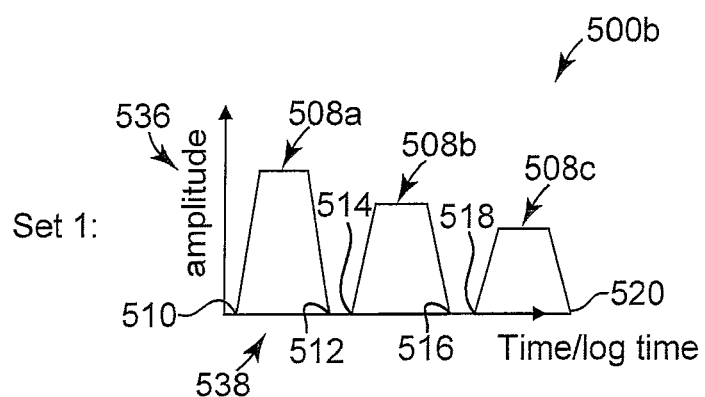
FIG. 10B is a timing diagram illustrating one embodiment of first set pulses for programming a phase change memory cell.
Figure 10C:
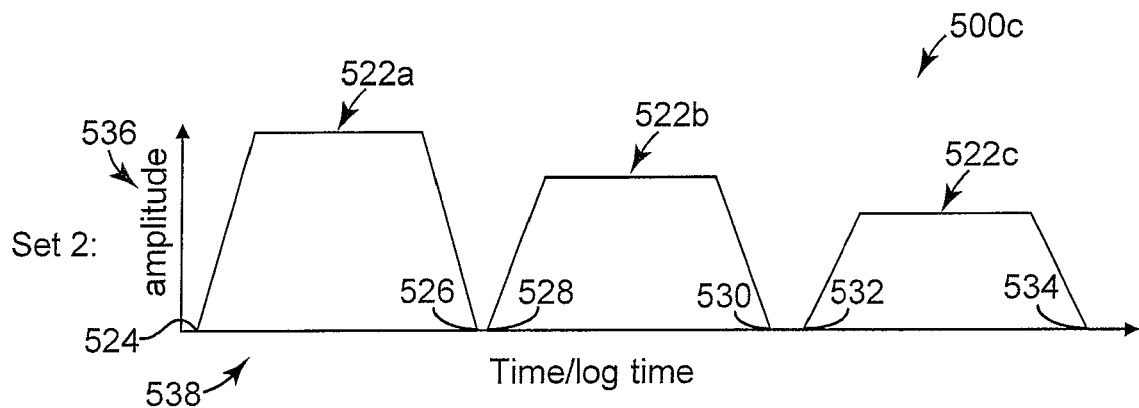
FIG. 10C is a timing diagram illustrating one embodiment of second set pulses for programming a phase change memory cell.

FIG. 10A is timing diagram 500a illustrating one embodiment of a reset pulse 502 for programming a phase change memory cell, such as phase change memory cell 200, 220, 240, 260, 280, or 300. FIG. 10B is timing diagram 500b illustrating one embodiment of first set pulses 508 for programming a phase change memory cell. FIG. 10C is timing diagram 500c illustrating one embodiment of second set pulses 522 for programming a phase change memory cell.

Timing diagrams 500 include time/log time on x-axis 538 and pulse amplitude on y-axis 536. Reset pulse 502 begins at 504 and ends at 504. First set pulses 508 include a first set pulse 508a that begins at 510 and ends at 512, a first set pulse 508b that begins at 514 and ends at 516, and a first set pulse 508c that begins at 518 and ends at 520. Second set pulses 522 include a second set pulse 522a that begins at 524 and ends at 526, a second set pulse 522b that begins at 528 and ends at 530, and a second set pulse 522c that begins at 532 and ends at 534.

Reset pulse 502 is similar to reset pulse 402 as previously described and illustrated with reference to FIG. 8A. First set pulses 508 and second set pulses 522 each include a series of three pulses of similar time length in decreasing amplitude, in accordance with one embodiment. In other embodiments, first set pulses 508 and second set pulses 522 include any suitable number of two or more set pulses. The temperature of a particular phase change memory cell can vary in response to a set pulse because of variations in the critical dimension (CD) during fabrication. Providing multiple set pulses of different amplitudes increases the likelihood that at least one of the set pulses will provide the optimum temperature for that particular phase change memory cell. First set pulse 508c has a lower amplitude than first set pulse 508b. First set pulse 508b has a lower amplitude than first set pulse 508a. Second set pulse 522c has a lower amplitude than second set pulse 522b. Second set pulse 522b has a lower amplitude than second set pulse 522a. First set pulses 508 each have a lower amplitude and a larger pulse width than reset pulse 502. Second set pulses 522 each have a larger pulse width than reset pulse 502. Second set pulse 522a has a higher, lower, or equal amplitude and a larger pulse width than first set pulse 508a. Second set pulse 522b has a higher, lower, or equal amplitude and a larger pulse width than first set pulse 508b. Second set pulse 522c has a higher, lower, or equal amplitude and a larger pulse width than first set pulse 508c.

To program a selected phase change memory cell to one of three resistance states, write circuit 102 generates a current or voltage pulse for heating at least one of a first phase change material layer and a second phase change material layer. Write circuit 102 generates reset pulse 502 to program the selected phase change memory cell to a first state. Reset pulse 502 programs the first phase change material layer and the second phase change material layer to an amorphous state.

Write circuit 102 generates first set pulses 508 to program phase change memory cell 200a to a second state. First set pulses 508 programs a selected phase change material layer with the faster crystallization speed. If a first phase change material layer has a faster crystallization speed than a second phase change material layer, then first set pulses 508 program the first phase change material layer to a crystalline state. If the second phase change material layer has a faster crystallization speed than the first phase change material layer, then first set pulses 508 program the second phase change material layer to a crystalline state.

Write circuit 102 generates second set pulses 522 to program phase change memory cell 200a to a third state. Second set pulses 522 programs the first phase change material layer and the second phase change material layer to a crystalline state.

Figure 11A:
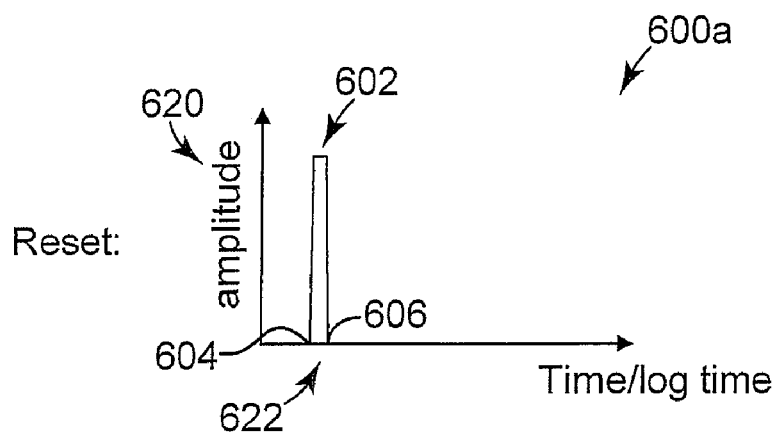
FIG. 11A is a timing diagram illustrating one embodiment of a reset pulse for programming a phase change memory cell.
Figure 11B:
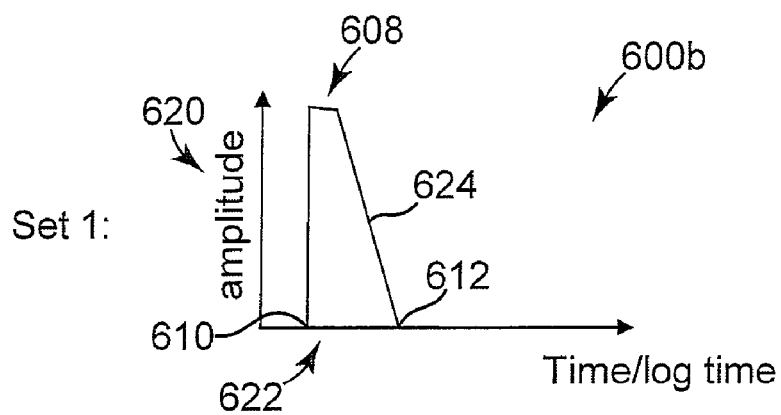
FIG. 11B is a timing diagram illustrating one embodiment of a first set pulse for programming a phase change memory cell.
Figure 11C:
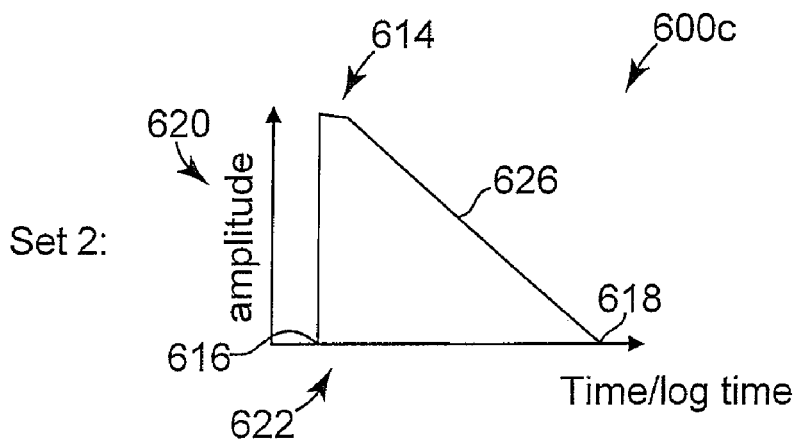
FIG. 11C is a timing diagram illustrating one embodiment of a second set pulse for programming a phase change memory cell.

FIG. 11A is a timing diagram 600a illustrating one embodiment of a reset pulse 602 for programming a phase change memory cell, such as phase change memory cell 200, 220, 240, 260, 280, or 300. FIG. 11B is a timing diagram 600b illustrating one embodiment of a first set pulse 608 for programming a phase change memory cell. FIG. 11C is a timing diagram 600c illustrating one embodiment of a second set pulse 614 for programming a phase change memory cell.

Timing diagrams 600 include time/log time on x-axis 622 and pulse amplitude on y-axis 620. Reset pulse 602 begins at 604 and ends at 606. First set pulse 608 begins at 610 and ends at 612. Second set pulse 614 begins at 616 and ends at 618.

Reset pulse 602 is similar to reset pulse 402 previously described and illustrated with reference to FIG. 8A. First set pulse 608 includes a tail 624. Second set pulse 614 includes a tail 626. Tail 624 and tail 626 each decrease in amplitude as time/log time increases. Tail 626 is longer than tail 624. The temperature of a particular phase change memory cell can vary in response to a set pulse because of variations in the CD during fabrication. Providing a longer tail having a range of amplitudes increases the likelihood that the set pulse will provide the optimum temperature for that particular phase change memory cell.

To program a selected phase change memory cell to one of three resistance states, write circuit 102 generates a current or voltage pulse for heating at least one of a first phase change material layer and a second phase change material layer. Write circuit 102 generates reset pulse 602 to program the selected phase change memory cell to a first state. Reset pulse 602 programs the first phase change material layer and the second phase change material layer to an amorphous state.

Write circuit 102 generates first set pulse 608 to program the selected phase change memory cell to a second state. First set pulse 608 programs a selected phase change material layer with the faster crystallization speed. If a first phase change material layer has a faster crystallization speed than a second phase change material layer, then first set pulse 608 programs the first phase change material layer to a crystalline state. If the second phase change material layer has a faster crystallization speed than the first phase change material layer, then first set pulse 608 programs the second phase change material layer to a crystalline state.

Write circuit 102 generates second set pulse 614 to program the selected phase change memory cell to a third state. Second set pulse 614 programs the first phase change material layer and the second phase change material layer to a crystalline state.

Figure 12A:
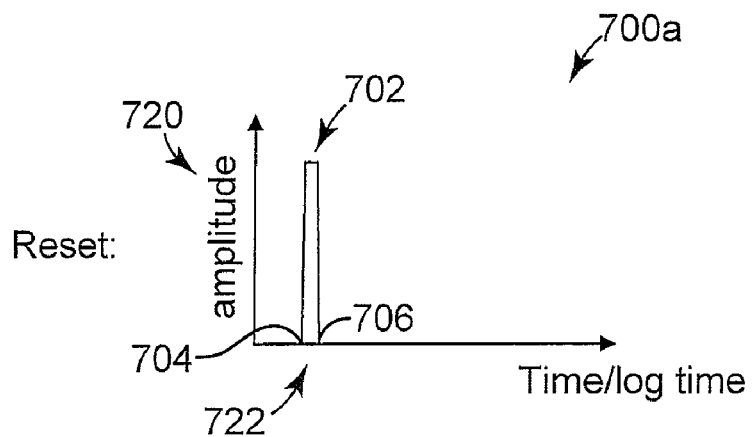
FIG. 12A is a timing diagram illustrating one embodiment of a reset pulse for programming a phase change memory cell.
Figure 12B:
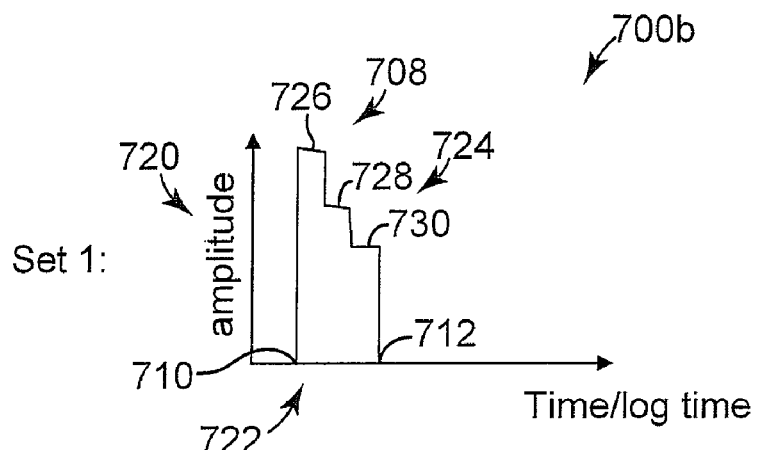
FIG. 12B is a timing diagram illustrating one embodiment of a first set pulse for programming a phase change memory cell.
Figure 12C:
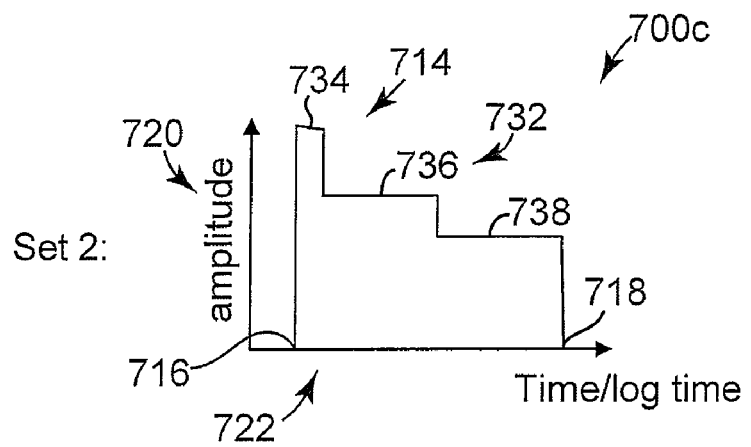
FIG. 12C is a timing diagram illustrating one embodiment of a second set pulse for programming a phase change memory cell.

FIG. 12A is a timing diagram 700a illustrating one embodiment of a reset pulse 702 for programming a phase change memory cell. FIG. 12B is a timing diagram 700b illustrating one embodiment of a first set pulse 708 for programming a phase change memory cell. FIG. 12C is a timing diagram 700c illustrating one embodiment of a second set pulse 714 for programming a phase change memory cell.

Timing diagrams 700 include time/log time on x-axis 722 and pulse amplitude on y-axis 720. Reset pulse 702 begins at 704 and ends at 706. First set pulse 708 begins at 710 and ends at 712. Second set pulse 714 begins at 716 and ends at 718.

Reset pulse 702 is similar to reset pulse 402 previously described and illustrated with reference to FIG. 8A. First set pulse 708 includes a tail 724 that includes a first step 726, a second step 728, and a third step 730, in accordance with one embodiment. In other embodiments, tail 724 includes any suitable number of two or more steps. Second step 728 has a lower amplitude first step 726. Third step 730 has a lower amplitude than second step 728. Second set pulse 714 includes a tail 732 that includes a first step 734, a second step 736, and a third step 738. Second step 736 has a lower amplitude than first step 734. Third step 738 has a lower amplitude than second step 736. Tail 732 is longer than tail 724. First step 734 is longer than first step 726. Second step 736 is longer than second step 728. Third step 738 is longer than third step 730. The temperature of a particular phase change memory cell can vary in response to a set pulse because of variations in the CD during fabrication. Providing a tail with multiple steps having different amplitudes increases the likelihood that the set pulse will provide the optimum temperature for that particular phase change memory cell.

To program a selected phase change memory cell to one of three resistance states, write circuit 102 generates a current or voltage pulse for heating at least one of a first phase change material layer and a second phase change material layer. Write circuit 102 generates reset pulse 702 to program the selected phase change memory cell to a first state. Reset pulse 702 programs the first phase change material layer and the second phase change material layer to an amorphous state.

Write circuit 102 generates first set pulse 708 to program the selected phase change memory cell to a second state. First set pulse 708 programs a selected phase change material layer with the faster crystallization speed. If a first phase change material layer has a faster crystallization speed than a second phase change material layer, then first set pulse 708 programs the first phase change material layer to a crystalline state. If the second phase change material layer has a faster crystallization speed than the first phase change material layer, then first set pulse 708 programs the second phase change material layer to a crystalline state.

Write circuit 102 generates second set pulse 714 to program the selected phase change memory cell to a third state. Second set pulse 714 programs the first phase change material layer and the second phase change material layer to a crystalline state.

Embodiments of the present invention provide a phase change memory cell including a plurality of layers of one or more phase change materials, each layer having a different crystallization speed. By including phase change material layers with different crystallizations speeds, the phase change memory cell can be more reliably programmed to define three or more states for storing data. In particular, the resistance of the phase change memory cell differs, thereby exhibiting a different state, depending on whether each phase change material layer is amorphous or crystalline. Embodiments of the present invention also provide pulse sequences for programming the phase change memory cell.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
a first electrode;
a second electrode;
a first resistivity changing material between the first electrode and the second electrode; and
a second resistivity changing material between the first electrode and the second electrode;
wherein the first resistivity changing material and the second resistivity changing material have different crystallization speeds, and
wherein the first electrode, the second electrode, the first resistivity changing material, and the second resistivity changing material are aligned.

2. The integrated circuit of claim 1, further comprising:
a diffusion barrier between the first resistivity changing material and the second resistivity changing material.

3. The integrated circuit of claim 1, further comprising:
shunt resistors surrounding at least one of the first resistivity changing material and the second resistivity changing material.

4. The integrated circuit of claim 1, wherein the first resistivity changing material and the second resistivity changing material have different cross-sectional widths.

5. A memory cell comprising:
a first electrode;
a first resistivity changing material directly contacting the first electrode and vertically adjacent the first electrode;
a second resistivity changing material vertically adjacent the first resistivity changing material; and
a second electrode directly contacting the second resistivity changing material,
wherein the first resistivity changing material and the second resistivity changing material have different crystallization speeds.

6. The memory cell of claim 5, further comprising:
a diffusion barrier directly contacting the first resistivity changing material and the second resistivity changing material.

7. The memory of cell of claim 6, wherein the diffusion barrier comprise one of TiN, TaN, W, Al, WN, TaSiN, TiSiN, TiAlN, C, and Cu.

8. The memory of cell of claim 5, wherein the first electrode and the second electrode comprise one of TiN, TaN, W, Al, WN, TaSiN, TiSiN, TiAlN, C and Cu.

9. The memory cell of claim 5, further comprising:
shunt resistors laterally surrounding at least one of the first resistivity changing material and the second resistivity changing material.

10. The memory cell of claim 5, wherein the first resistivity changing material and the second resistivity changing material have different cross-sectional widths.

11. The memory cell of claim 5, further comprising:
insulation material laterally surrounding the first electrode, the first resistivity changing material, the second resistivity changing material, and the second electrode.

12. A memory cell comprising:
a first electrode;
a first phase change material layer over the first electrode;
a second phase change material layer over the first phase change material layer; and
a second electrode over the second phase change material layer,
wherein the first phase change material layer and the second phase change material layer have different crystallization speeds.

13. The memory cell of claim 12, further comprising:
a diffusion barrier between the first phase change material layer and the second phase change material layer.

14. The memory of cell of claim 13, wherein the diffusion barrier comprise one of TiN, TaN, W, Al, WN, TaSiN, TiSiN, TiAlN, C, and Cu.

15. The memory of cell of claim 12, wherein the first electrode and the second electrode comprise one of TiN, TaN, W, Al, WN, TaSiN, TiSiN, TiAlN, C and Cu.

16. The memory cell of claim 12, further comprising:
shunt resistors laterally surrounding at least one of the first phase change material layer and the second phase change material layer.

17. The memory cell of claim 12, wherein the first phase change material layer and the second phase change material layer have different cross-sectional widths.

18. The memory cell of claim 12, further comprising:
insulation material laterally surrounding the first electrode, the first phase change material layer, the second phase change material layer, and the second electrode.

* * * * *